(12) United States Patent
Yamamoto et al.

(10) Patent No.: US 9,336,736 B2
(45) Date of Patent: May 10, 2016

(54) LIQUID CRYSTAL DISPLAY DEVICE AND METHOD FOR DRIVING AUXILIARY CAPACITANCE LINES

(75) Inventors: Kaoru Yamamoto, Osaka (JP); Seiji Kaneko, Osaka (JP); Yasuyuki Ogawa, Osaka (JP); Kohhei Tanaka, Osaka (JP); Seiichi Uchida, Osaka (JP); Yutaka Takamaru, Osaka (JP); Shigeyasu Mori, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 301 days.

(21) Appl. No.: 14/235,125

(22) PCT Filed: Jul. 25, 2012

(86) PCT No.: PCT/JP2012/068758
§ 371 (c)(1),
(2), (4) Date: Jan. 27, 2014

(87) PCT Pub. No.: WO2013/018596
PCT Pub. Date: Feb. 7, 2013

(65) Prior Publication Data
US 2014/0168182 A1    Jun. 19, 2014

(30) Foreign Application Priority Data
Aug. 2, 2011 (JP) .................................. 2011-169050

(51) Int. Cl.
*G09G 3/36* (2006.01)
*G11C 19/28* (2006.01)
*G02F 1/1362* (2006.01)

(52) U.S. Cl.
CPC ............ *G09G 3/3677* (2013.01); *G09G 3/3655* (2013.01); *G11C 19/28* (2013.01);
(Continued)

(58) Field of Classification Search
CPC . G09G 3/3677; G09G 3/3655; G09G 3/3614; G09G 2300/0876; G09G 2330/023; G11C 19/28; G02F 1/136213
See application file for complete search history.

(56) References Cited

U.S. PATENT DOCUMENTS 6,677,925 B1 * 1/2004 Kawaguchi .......... G09G 3/3655
                                                       345/55
6,864,871 B1 * 3/2005 Okada ................... G09G 3/006
                                                       345/90

(Continued)

FOREIGN PATENT DOCUMENTS

JP          05-216443 A      8/1993
JP          2001-312253 A    11/2001

(Continued)

OTHER PUBLICATIONS

Official Communication issued in International Patent Application No. PCT/JP2012/068758, mailed on Oct. 30, 2012.

*Primary Examiner* — Tom Sheng
(74) *Attorney, Agent, or Firm* — Keating & Bennett, LLP

(57) ABSTRACT

Provided is a liquid crystal display device with reduced power consumption employing a CS drive method.
A CS driver (500) consists of a CS shift register (510) and a CS output portion (520). The CS shift register (510) outputs control signals (COUT(1) to COUT(m)) in accordance with a CS clock signal CCK. The CS output portion (520) outputs auxiliary capacitance signals (CSS(1) to CSS(m)) in accordance with the control signals (COUT(1) to COUT(m)), respectively. An idle period (T2) is set following a scanning period (T1). During the idle period (T2), the CS driver (500) is driven in accordance with the CS clock signal (CCK) at an idle-period CS frequency (fcck2). The idle-period CS frequency (fcck2) is lower than a scanning-period CS frequency (fcck1).

18 Claims, 28 Drawing Sheets

(52) U.S. Cl.
CPC ........ *G02F1/136213* (2013.01); *G09G 3/3614* (2013.01); *G09G 2300/0876* (2013.01); *G09G 2330/023* (2013.01)

(56) References Cited

U.S. PATENT DOCUMENTS

| | | | | |
|---|---|---|---|---|
| 8,723,786 | B2* | 5/2014 | Takeuchi | G09G 3/3655 345/103 |
| 2002/0180673 | A1 | 12/2002 | Tsuda et al. | |
| 2003/0231735 | A1 | 12/2003 | Moon et al. | |
| 2005/0035938 | A1* | 2/2005 | Noda | G09G 3/3655 345/100 |
| 2005/0052385 | A1* | 3/2005 | Noda | G09G 3/3655 345/87 |
| 2006/0007210 | A1* | 1/2006 | Nishikubo | G09G 3/3655 345/204 |
| 2008/0062112 | A1* | 3/2008 | Umezaki | G09G 3/342 345/100 |
| 2009/0002586 | A1* | 1/2009 | Kimura | G02F 1/136213 349/39 |
| 2009/0109361 | A1* | 4/2009 | Ishii | G09G 3/3655 349/39 |
| 2009/0303168 | A1* | 12/2009 | Nagata | G09G 3/3655 345/90 |
| 2010/0118058 | A1* | 5/2010 | Murai | G09G 3/3648 345/690 |
| 2010/0265222 | A1* | 10/2010 | Tsuboi | G09G 3/003 345/205 |
| 2010/0309394 | A1* | 12/2010 | Numao | G09G 3/3655 348/792 |
| 2011/0142191 | A1 | 6/2011 | Tobita et al. | |
| 2011/0242073 | A1* | 10/2011 | Horiuchi | G02F 1/1337 345/204 |
| 2012/0162179 | A1* | 6/2012 | Tanaka | G09G 3/3677 345/211 |
| 2012/0169690 | A1* | 7/2012 | Sasaki | G09G 3/3659 345/209 |
| 2012/0242646 | A1* | 9/2012 | Yamato | G09G 3/3648 345/212 |
| 2013/0009924 | A1* | 1/2013 | Imai | G09G 3/3655 345/204 |
| 2013/0147783 | A1* | 6/2013 | Yamauchi | G09G 3/3614 345/212 |

FOREIGN PATENT DOCUMENTS

| | | |
|---|---|---|
| JP | 2002-182619 A | 6/2002 |
| JP | 2004-078172 A | 3/2004 |
| JP | 2006-053349 A | 2/2006 |
| JP | 2006-267313 A | 10/2006 |
| JP | 2009-086170 A | 4/2009 |
| JP | 2011-123963 A | 6/2011 |

* cited by examiner

LIQUID CRYSTAL DISPLAY DEVICE AND METHOD FOR DRIVING AUXILIARY CAPACITANCE LINES

TECHNICAL FIELD

The present invention relates to liquid crystal display devices and methods for driving auxiliary capacitance lines in the liquid crystal display devices, particularly to a liquid crystal display device with a monolithic driver and a method for driving auxiliary capacitance lines in the liquid crystal display device.

BACKGROUND ART

Conventionally, there is some demand for low power consumption in active-matrix liquid crystal display devices. One of the known approaches to achieve low power consumption is to perform polarity-inversion drive by changing the potential of a corresponding auxiliary capacitance line after the end of a selection period for each scanning signal line. Such a drive method will be referred to below as a "CS drive method". The CS drive method allows application of a large voltage to a liquid crystal layer with a small video-signal amplitude, so that power consumption can be reduced. Such a drive method is disclosed in, for example, Patent Document 1.

Furthermore, in recent years, more drivers for driving liquid crystal panels have been formed directly on substrates included in the liquid crystal panels. Examples of such a driver include a gate driver (scanning signal line driver circuit) for driving gate lines (scanning signal lines) and a CS driver (auxiliary capacitance line driver circuit) for driving CS lines (auxiliary capacitance lines as mentioned above). Such a driver is called a "monolithic driver" or suchlike. A liquid crystal display device equipped with such a monolithic driver (referred to below as a "liquid crystal display device with a monolithic driver") is described in, for example, Patent Document 2. This liquid crystal display device with a monolithic driver renders it possible to achieve a narrow frame region and cost reduction. Conventionally, such a liquid crystal display device with a monolithic driver employs thin-film transistors with amorphous-silicon (a-Si) semiconductor layers (referred to below as "a-Si TFTs") as drive elements.

Incidentally, Patent Document 3 discloses a drive method for a display device in which a scanning period T1 in which gate lines are scanned is followed by an idle period T2 in which all of the gate lines are not scanned. During the idle period T2, the gate driver is not provided with signals such as clock signals. Accordingly, even when the gate lines are scanned at 60 Hz during the scanning period T1, the total drive frequency for the gate lines can be maintained at about 30 Hz, for example, by setting the idle period T2 to the same length as the scanning period T1. As a result, low power consumption can be achieved.

CITATION LIST

Patent Documents

Patent Document 1: Japanese Laid-Open Patent Publication No. 2009-86170
Patent Document 2: Japanese Laid-Open Patent Publication No. 2004-78172
Patent Document 3 Japanese Laid-Open Patent Publication No. 2001-312253

SUMMARY OF THE INVENTION

Problems to be Solved by the Invention

The CS drive method as described above renders it possible to reduce power consumption in liquid crystal display devices, but there is some demand for further reduction in power consumption in liquid crystal display devices.

Therefore, an objective of the present invention is to provide a liquid crystal display device with reduced power consumption employing a CS drive method, and a method for driving auxiliary capacitance lines in the liquid crystal display device.

Solution to the Problems

A first aspect of the present invention is directed to a liquid crystal display device comprising:
a display portion including a plurality of video signal lines, a plurality of scanning signal lines crossing the video signal lines, a plurality of pixel forming portions including respective pixel electrodes arranged in a matrix so as to correspond to the video signal lines and the scanning signal lines, a plurality of auxiliary capacitance lines arranged along the scanning signal lines, and auxiliary capacitors formed between the auxiliary capacitance lines and the pixel electrodes corresponding to the scanning signal lines along the auxiliary capacitance lines;
a display control circuit for generating clock signals alternating between on- and off-levels cyclically;
a scanning signal line driver circuit for driving the scanning signal lines such that a scanning period in which the scanning signal lines are selected sequentially and an idle period in which all of the scanning signal lines are in an unselected state alternate with each other in cycles of a frame period consisting of the scanning period and the idle period; and
an auxiliary capacitance line driver circuit formed integrally with the display portion to drive the auxiliary capacitance lines independently of one another in accordance with auxiliary capacitance clock signals included in the clock signals, wherein,
the auxiliary capacitance line driver circuit includes a first shift register with a plurality of first bistable circuits cascaded to one another, the first shift register sequentially setting output signals from the first bistable circuits to an on-level in accordance with first shift operation clock signals included in the auxiliary capacitance clock signals, and
the first shift operation clock signals have a lower frequency during the idle period than during the scanning period.

In a second aspect of the present invention, based on the first aspect of the invention, the first shift operation clock signals have a lower amplitude during the idle period than during the scanning period.

In a third aspect of the present invention, based on the first aspect of the invention, the idle period is longer than the scanning period.

In a fourth aspect of the present invention, based on the first aspect of the invention, the auxiliary capacitance line driver circuit further includes a plurality of first switching elements with first conduction terminals respectively connected to the auxiliary capacitance lines, the display control circuit provides a bias signal to a second conduction terminal of each of the first switching elements, the bias signal switching between two potentials every frame period and being fixed at one of the potentials during each frame period, and each of the first switching elements is provided with an output signal at a control terminal, the output signal being derived from the first bistable circuit that corresponds to the auxiliary capacitance line connected to the first conduction terminal of the first switching element.

In a fifth aspect of the present invention, based on the fourth aspect of the invention, the display control circuit provides a first bias signal as the bias signal to the second conduction terminal of one of the first switching elements whose first conduction terminals are respectively connected to adjacent auxiliary capacitance lines, and also provides a second bias signal as the bias signal to the second conduction terminal of the other of the first switching elements whose first conduction terminals are respectively connected to the adjacent auxiliary capacitance lines, and the first bias signal and the second bias signal differ in potential during each frame period.

In a sixth aspect of the present invention, based on the fourth aspect of the invention, the auxiliary capacitance line driver circuit further includes a plurality of second switching elements respectively corresponding to the first switching elements, the display control circuit provides an idle-period operation clock signal included in the auxiliary capacitance clock signal to a control terminal of each of the second switching elements, the idle-period operation clock signal having a potential that is at an off-level during the scanning period and that alternates between on- and off-levels cyclically during the idle period, and also having a lower frequency during the idle period than a frequency of the first shift operation clock signals during the scanning period, a first conduction terminal of each of the second switching elements is connected to the auxiliary capacitance line that is connected to the first conduction terminal of the first switching element that corresponds to the second switching element, and the bias signal provided to the second conduction terminal of the first switching element that corresponds to the second switching element is provided to a second conduction terminal of each of the second switching elements.

In a seventh aspect of the present invention, based on the first aspect of the invention, the first shift operation clock signals are of three or more phases different from one another.

In an eighth aspect of the present invention, based on the first aspect of the invention, the scanning signal line driver circuit is formed integrally with the display portion.

In a ninth aspect of the present invention, based on the eighth aspect of the invention, the scanning signal line driver circuit includes a second shift register for sequentially setting output signals from a plurality of second bistable circuits cascaded to one another, to an on-level in accordance with a plurality of second shift operation clock signals included in the clock signals, the scanning signal line driver circuit providing the output signals from the second bistable circuits to the scanning signal lines, respectively.

In a tenth aspect of the present invention, based on the eighth aspect of the invention, the scanning signal line driver circuit and the auxiliary capacitance line driver circuit share the first shift register, the scanning signal line driver circuit further includes a plurality of output buffers provided corresponding to the first bistable circuits respectively, the display control circuit provides the output buffers with buffer input signals being set at an on-level during the scanning period and also at an off-level during the idle period, and the output buffers provide the scanning signal lines with logical ANDs of the buffer input signals and output signals from the first bistable circuits corresponding thereto.

In an eleventh aspect of the present invention, based on any of the first through seventh aspects of the invention, the auxiliary capacitance line driver circuit is realized using thin-film transistors whose semiconductor layers are made of an oxide semiconductor.

In a twelfth aspect of the present invention, based on any of the eighth through tenth aspects of the invention, the scanning signal line driver circuit and the auxiliary capacitance line driver circuit are realized using thin-film transistors whose semiconductor layers are made of an oxide semiconductor.

Ina thirteenth aspect of the present invention, based on any of the first through seventh aspects of the invention, the auxiliary capacitance line driver circuit is realized using thin-film transistors whose semiconductor layers are made of amorphous silicon.

In a fourteenth aspect of the present invention, based on any of the eighth through tenth aspects of the invention, the scanning signal line driver circuit and the auxiliary capacitance line driver circuit are realized using thin-film transistors whose semiconductor layers are made of amorphous silicon.

A fifteenth aspect of the present invention is directed to a drive method for auxiliary capacitance lines in a liquid crystal display device provided with a display portion including a plurality of video signal lines, a plurality of scanning signal lines crossing the video signal lines, a plurality of pixel forming portions including respective pixel electrodes arranged in a matrix so as to correspond to the video signal lines and the scanning signal lines, a plurality of auxiliary capacitance lines arranged along the scanning signal lines, and auxiliary capacitors formed between the auxiliary capacitance lines and the pixel electrodes corresponding to the scanning signal lines along the auxiliary capacitance lines, a display control circuit for generating clock signals alternating between on- and off-levels cyclically, a scanning signal line driver circuit for driving the scanning signal lines, and an auxiliary capacitance line driver circuit formed integrally with the display portion to drive the auxiliary capacitance lines, the method comprising the steps of:

driving the scanning signal lines such that a scanning period in which the scanning signal lines are selected sequentially and an idle period in which all of the scanning signal lines are in an unselected state alternate with each other in cycles of a frame period consisting of the scanning period and the idle period;

driving the auxiliary capacitance lines independently of one another in accordance with auxiliary capacitance clock signals included in the clock signals; and setting first shift operation clock signals included in the auxiliary capacitance clock signals at a lower frequency during the idle period than during the scanning period, wherein, the auxiliary capacitance line driver circuit includes a first shift register with a plurality of first bistable circuits cascaded to one another, the first shift register sequentially setting output signals from the first bistable circuits to an on-level in accordance with first shift operation clock signals.

In a sixteenth aspect of the present invention, based on the fifteenth aspect of the invention, the first shift operation clock signals have a lower amplitude during the idle period than during the scanning period.

In a seventeenth aspect of the present invention, based on the fifteenth aspect of the invention, the idle period is longer than the scanning period.

In an eighteenth aspect of the present invention, based on the fifteenth aspect of the invention, the first shift operation clock signals are of three or more phases different from one another.

Effect of the Invention

In the first aspect of the present invention, the display device has the display portion and the auxiliary capacitance line driver circuit formed integrally with each other, and includes the auxiliary capacitance lines that are driven independently of one another, and in this display device, one frame period consists of the scanning period and the idle period. Since the first shift operation clock signals have a lower frequency during the idle period than during the scanning period, the total drive frequency for the auxiliary capacitance line driver circuit during one frame period is reduced. This results in reduced power consumption. In addition, since the display portion and the auxiliary capacitance line driver circuit are formed integrally with each other, the frame region is reduced in area, and the cost of the auxiliary capacitance line driver circuit is reduced.

In the second aspect of the present invention, the first shift operation clock signals have a lower amplitude during the idle period than during the scanning period. Thus, lower power consumption can be achieved.

In the third aspect of the present invention, the idle period is longer than the scanning period. Thus, lower power consumption can be achieved.

According to the fourth aspect of the present invention, during the idle period, the bias signals provided to the auxiliary capacitance lines during the scanning period immediately before the idle period are provided to the auxiliary capacitance lines in accordance with the auxiliary capacitance clock signals. Accordingly, during the idle period, the influence of noise or suchlike on the auxiliary capacitance lines is reduced. As a result, display quality can be inhibited from being reduced. Moreover, since the first shift operation clock signals have a lower frequency during the idle period than during the scanning period, load on the first switching elements is reduced. As a result, threshold variations of the first switching elements are reduced, so that the reliability of the first switching elements can be inhibited from being reduced.

According to the fifth aspect of the present invention, adjacent auxiliary capacitance lines are provided with different potentials during the frame period consisting of the scanning period and the idle period. Thus, line-inversion drive can be performed to drive a plurality of auxiliary capacitance lines independently of one another.

The sixth aspect of the present invention renders it possible to achieve similar effects to those achieved by the first aspect of the invention, using idle-period operation clock signals in place of the first clock signals. Moreover, output signals from the first bistable circuits are not set to an on-level during the idle period, so that the load on the first switching elements can be further reduced. Thus, the reliability of the first switching elements can be further enhanced.

In the seventh aspect of the present invention, the number of phases of each of the first clock signals is three or more, so that the load capacitance of the elements in the bistable circuits can be sufficiently reduced. Thus, even lower power consumption can be achieved.

In the eighth aspect of the present invention, the scanning signal line driver circuit is also formed integrally with the display portion, resulting in reduced cost of the scanning signal line driver circuit and a further narrowing of the frame region.

The ninth aspect of the present invention allows the auxiliary capacitance line driver circuit and the scanning signal line driver circuit to be realized using individually different shift registers.

In the tenth aspect of the present invention, the auxiliary capacitance line driver circuit and the scanning signal line driver circuit share one shift register. As a result, circuit scale can be reduced, leading to, for example, an even narrower frame region.

In the eleventh aspect of the present invention, the auxiliary capacitance line driver circuit is realized using thin-film transistors whose semiconductor layers are made of an oxide semiconductor. Leakage current from the thin-film transistors is sufficiently small, and therefore, the frequency of the clock signals during the idle period can be further reduced. Accordingly, even lower power consumption can be achieved. Moreover, the on-state current of the thin-film transistors whose semiconductor layers are made of an oxide semiconductor is sufficiently high, and therefore, the size of the thin-film transistors can be rendered sufficiently small. Thus, the frame region can be rendered even narrower.

In the twelfth aspect of the present invention, the scanning signal line driver circuit and the auxiliary capacitance line driver circuit are realized using thin-film transistors whose semiconductor layers are made of an oxide semiconductor. Leakage current from the thin-film transistors is sufficiently small, and therefore, the frequency of the clock signals during the idle period can be further reduced. Accordingly, even lower power consumption can be achieved. Moreover, the on-state current of the thin-film transistors whose semiconductor layers are made of an oxide semiconductor is sufficiently high, and therefore, the size of the thin-film transistors can be rendered sufficiently small. Thus, the frame region can be rendered even narrower.

In the thirteenth aspect of the present invention, the auxiliary capacitance line driver circuit is realized using thin-film transistors whose semiconductor layers are made of amorphous silicon. Thus, a further cost reduction can be achieved.

In the fourteenth aspect of the present invention, the scanning signal line driver circuit and the auxiliary capacitance line driver circuit are realized using thin-film transistors whose semiconductor layers are made of amorphous silicon. Thus, a further cost reduction can be achieved.

The fifteenth through eighteenth aspects of the present invention allow the drive methods for display devices to achieve similar effects to those achieved by the first through third aspects and the seventh aspect, respectively, of the invention.

MODES FOR CARRYING OUT THE INVENTION

Hereinafter, embodiments of the present invention will be described with reference to the accompanying drawings. Note that in the following, the gate, drain, and source terminals of the thin-film transistor correspond to a control terminal, a first conduction terminal, and a second conduction terminal, respectively. Moreover, all thin-film transistors will be described as being of an n-channel type.

<1. First Embodiment>
<1.1 Overall Configuration and Operation>

Figure 1:
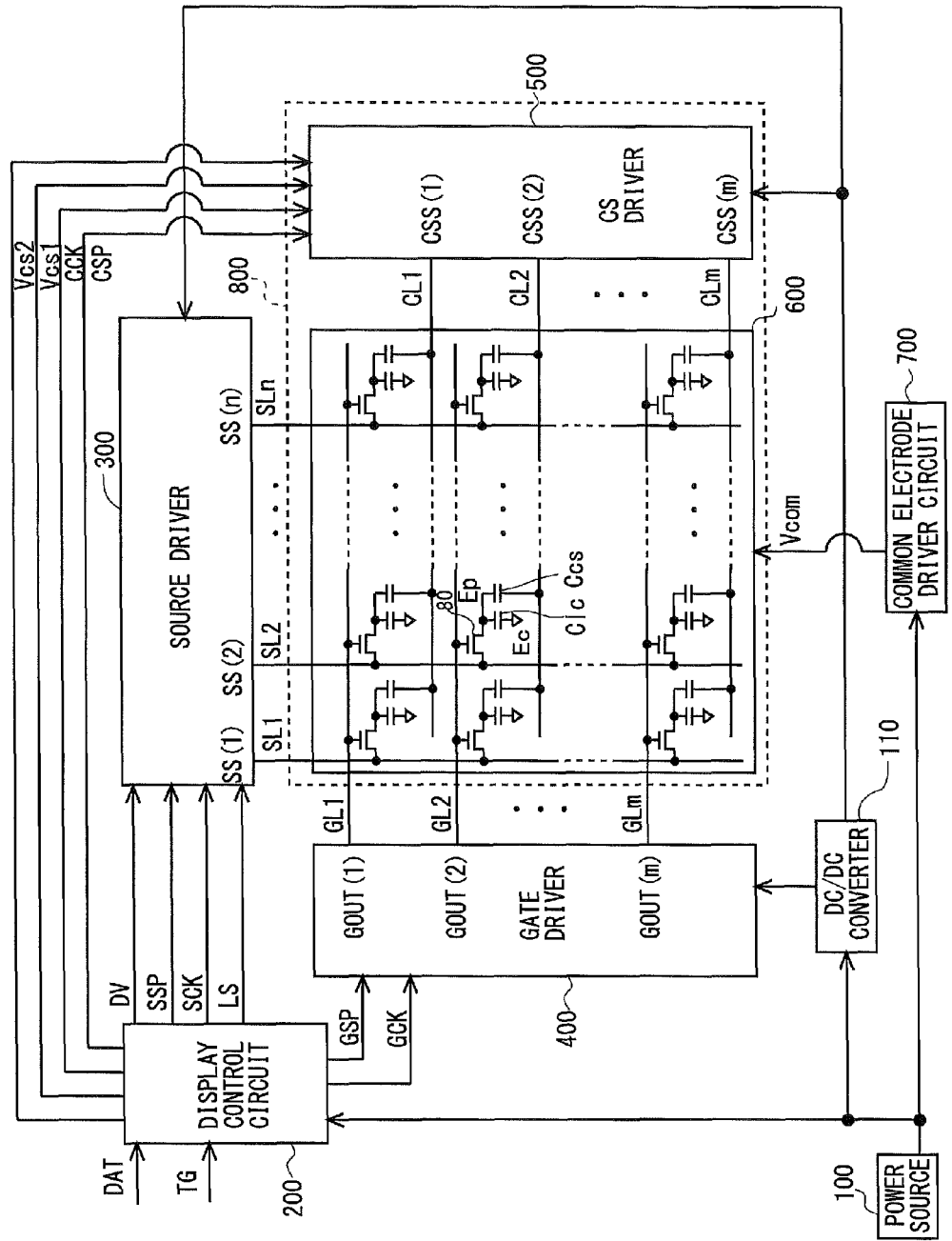
FIG. 1 is a block diagram illustrating the overall configuration of a liquid crystal display device according to a first embodiment of the present invention.

FIG. 1 is a block diagram illustrating the overall configuration of an active-matrix liquid crystal display device employing a CS drive method according to a first embodiment of the present invention. This liquid crystal display device includes a power source 100, a DC/DC converter 110, a display control circuit 200, a source driver (video signal line driver circuit) 300, a gate driver (scanning signal line driver circuit) 400, a CS driver (auxiliary capacitance line driver circuit) 500, a display portion 600, and a common electrode driver circuit 700, as shown in FIG. 1. The CS driver 500 is formed of, for example, amorphous silicon, polycrystalline silicon, microcrystalline silicon, or an oxide semiconductor on a liquid crystal display panel 800 including the display portion 600. That is, the liquid crystal display device according to the present embodiment is a liquid crystal display device with a monolithic CS driver in which the CS driver 500 and the display portion 600 are formed on the same substrate (an array substrate, which is one of the two substrates that constitute the liquid crystal display panel). Thus, the frame region of the liquid crystal display device can be reduced in area. Note that the gate driver 400 and/or the source driver 300 may also be formed of, for example, amorphous silicon, polycrystalline silicon, microcrystalline silicon, or an oxide semiconductor on the liquid crystal display panel 800. Specific practical examples using amorphous silicon and IGZO will be described later.

The display portion 600 has formed thereon n source lines (video signal lines) $SL_1$ to $SL_n$, m gate lines (scanning signal lines) $GL_1$ to $GL_m$, m CS lines (auxiliary capacitance lines) $CL_1$ to $CL_m$ arranged along the m gate lines $GL_1$ to $GL_m$, respectively, and m×n pixel forming portions provided corresponding to respective intersections of the source lines $SL_1$ to $SL_n$ and the gate lines $GL_1$ to $GL_m$. The m×n pixel forming portions are arranged in a matrix, thereby forming pixel arrays. Each pixel forming portion includes a pixel thin-film transistor 80, which is a switching element connected at a gate terminal to the gate line that passes through its corresponding intersection and at a source terminal to the source line that passes through the intersection, a pixel electrode Ep connected to a drain terminal of the pixel thin-film transistor 80, a common electrode Ec, which is an opposing electrode provided commonly for the pixel forming portions, and a liquid crystal layer provided commonly for the pixel forming portions between the pixel electrode Ep and the common electrode Ec. The pixel electrode Ep and the common electrode Ec form a liquid crystal capacitor Clc. Moreover, the CS line (also referred to as the "auxiliary capacitance electrode") disposed along the gate line that passes through the corresponding intersection and the pixel electrode Ep corresponding to the gate line disposed along the CS line form an auxiliary capacitor Ccs. The liquid crystal capacitor Clc and the auxiliary capacitor Ccs form a pixel capacitor Cp.

The power source 100 supplies a predetermined source voltage to the DC/DC converter 110, the display control circuit 200, and the common electrode driver circuit 700. The DC/DC converter 110 generates a predetermined direct voltage from the source voltage to operate the source driver 300, the gate driver 400, and the CS driver 500, and supplies the generated voltage to the source driver 300, the gate driver 400, and the CS driver 500. The common electrode driver circuit 700 provides a predetermined potential Vcom to the common electrode Ec.

The display control circuit 200 receives an externally transmitted image signal DAT and an externally transmitted timing signal group TG, including a horizontal synchronization signal and a vertical synchronization signal, and outputs a digital video signal DV, along with a source start pulse signal SSP, a source clock signal SCK, a latch strobe signal LS, a gate start pulse signal GSP, a gate clock signal GCK, a first bias signal Vcs1, a second bias signal Vcs2, a CS clock signal CCK, and a CS start pulse signal CSP to control image display on the display panel 600. The potential levels of the gate clock signal GCK and the CS clock signal CCK are high at Vdd, and also low at Vss. In the present embodiment, the gate start pulse signal GSP, the gate clock signal GCK, the CS clock signal CCK, and the CS start pulse signal CSP realize clock signals. Moreover, the CS clock signal CCK and the CS start pulse signal CSP realize auxiliary capacitance clock signals.

The gate clock signal GCK consists of two phases, i.e., gate clock signals GCK1 and GCK2. In the following, the gate clock signal GCK1 will be referred to as the "first gate clock signal", and the gate clock signal GCK2 will be referred to as the "second gate clock signal". The first and second gate clock signals GCK1 and GCK2 are out of phase from each other by one horizontal scanning period, and each of them is set at a high-level potential (Vdd potential) for one of the two horizontal scanning periods (except in an idle period T2 to be described later). In the present embodiment, the first and second gate clock signals GCK1 and GCK2 realize second shift operation clock signals.

The CS clock signal CCK consists of two phases, i.e., CS clock signals CCK1 and CCK2. In the following, the CS clock signal CCK1 will be referred to as the "first CS clock signal", and the CS clock signal CCK2 will be referred to as the "second CS clock signal". The first and second CS clock signals CCK1 and CCK2 are out of phase from each other by one horizontal scanning period, and each of them is set at a high-level potential (Vdd potential) for one of the two horizontal scanning periods (except in the idle period T2 to be described later). In the present embodiment, the CS clock signal CCK is delayed in phase from the gate clock signal GCK by one horizontal scanning period. More specifically, the first and second CS clock signals CCK1 and CCK2 are delayed in phase from the first gate clock signal GCK1 and the second gate clock signal, respectively, by one horizontal scanning period. In the present embodiment, the first CS clock signal CCK1 and the second CS clock signal CCK2 realize first shift operation clock signals.

The source driver 300 receives the digital video signal DV, the source start pulse signal SSP, the source clock signal SCK, and the latch strobe signal LS outputted by the display control circuit 200, and applies D/A-converted analog video signals SS(1) to SS(n) to the source lines $SL_1$ to $SL_n$, respectively.

In accordance with the gate start pulse signal GSP and the gate clock signal GCK outputted by the display control circuit 200, the gate driver 400 repeats application of scanning signals GOUT(1) to GOUT(m) at a high-level potential to the gate lines $GL_1$ to $GL_m$, respectively, in cycles of one frame period. Note that the gate driver 400 will be described in detail later.

In accordance with the first bias signal Vcs1, the second bias signal Vcs2, the CS clock signal CCK, and the CS start pulse signal CSP outputted by the display control circuit 200, the CS driver 500 applies auxiliary capacitance signals CSS (1) to CSS (m) to the CS lines $CL_1$ to $CL_m$, respectively, to bias the potentials of the pixel electrodes Ep in the pixel forming portions (referred to below as the "pixel potentials" and denoted by the symbol Vd). Note that the CS driver 500 will be described in detail later.

In this manner, the video signals SS(1) to SS(n) are applied to the source lines $SL_1$ to $SL_n$, respectively, and the scanning signals GOUT(1) to GOUT(m) are applied to the gate lines $GL_1$ to $GL_m$, respectively, so that the display portion 600 displays an image based on the externally transmitted image signal DAT.

<1.2 Configuration and Operation of the Gate Driver>

Figure 2:
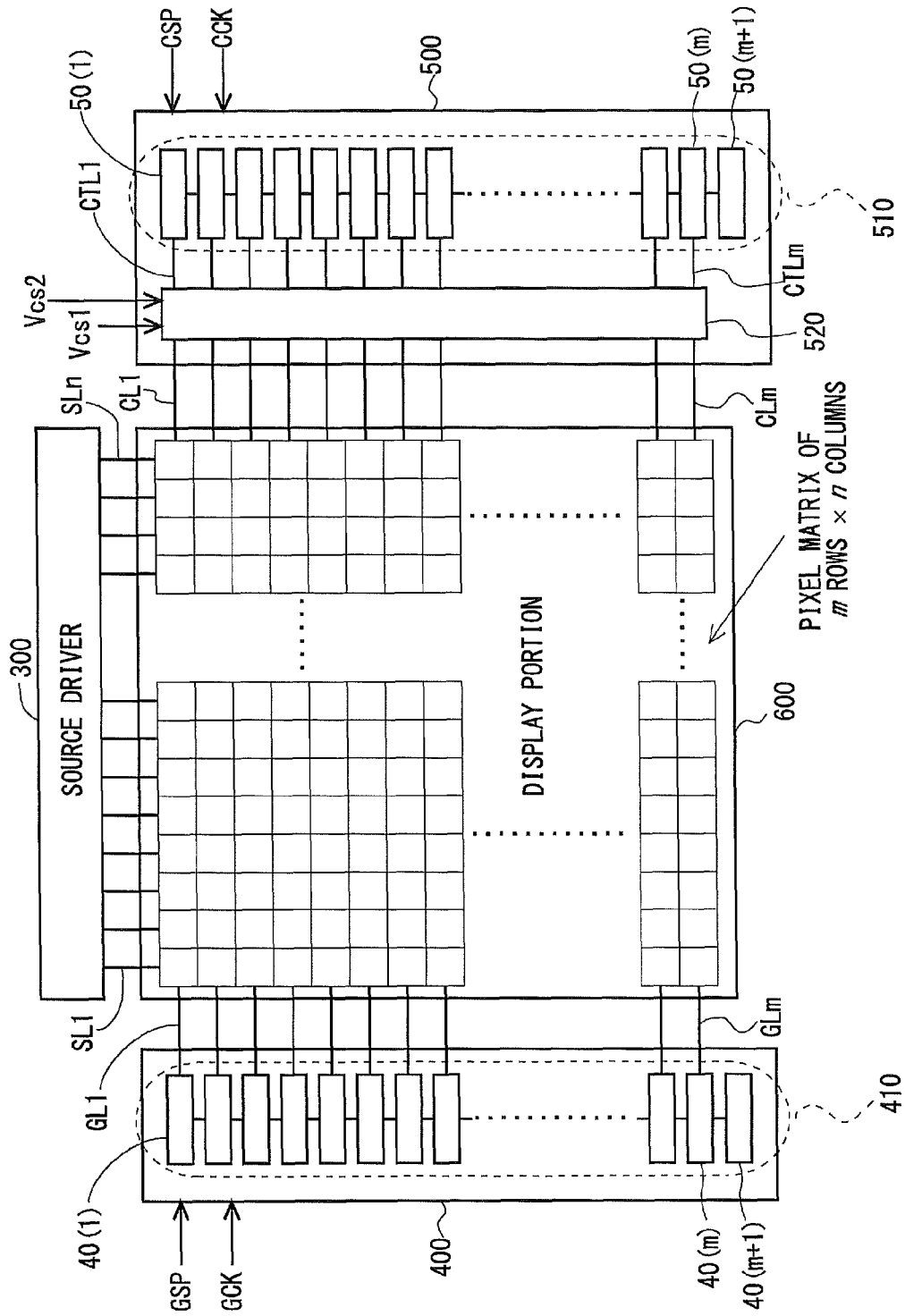
FIG. 2 is a block diagram describing the configurations of a gate driver and a CS driver in the first embodiment.

FIG. 2 is a block diagram describing the configurations of the gate driver 400 and the CS driver 500 in the present embodiment. The gate driver 400 includes a gate shift register 410 consisting of m (stages of) gate bistable circuits 40(1) to 40(*m*) and one (stage of) dummy gate bistable circuit 40(*m*+1) (also referred to below as a "dummy stage"), as shown in FIG. 2. Note that the CS driver 500 will be described later. In the present embodiment, the gate shift register 410 realizes a second shift register, and the gate bistable circuits realize second bistable circuits.

The display portion 600 has a pixel matrix of m rows×n columns formed thereon, as described above, and the gate bistable circuits are provided as stages in one-to-one correspondence with the rows of the pixel matrix. The gate bistable circuits and CS bistable circuits to be described later take either one of two states (first and second states) at each given time, and output signals that indicate the taken states (referred to below as "state signals"). In the present embodiment, when a bistable circuit is in the first state, the bistable circuit outputs a state signal at a high-level (on-level) potential, and when the bistable circuit is in the second state, the bistable circuit outputs a state signal at a low-level (off-level) potential. Moreover, the period in which the bistable circuit outputs a state signal at a high-level potential will be referred to below as the "selection period".

Figure 3:
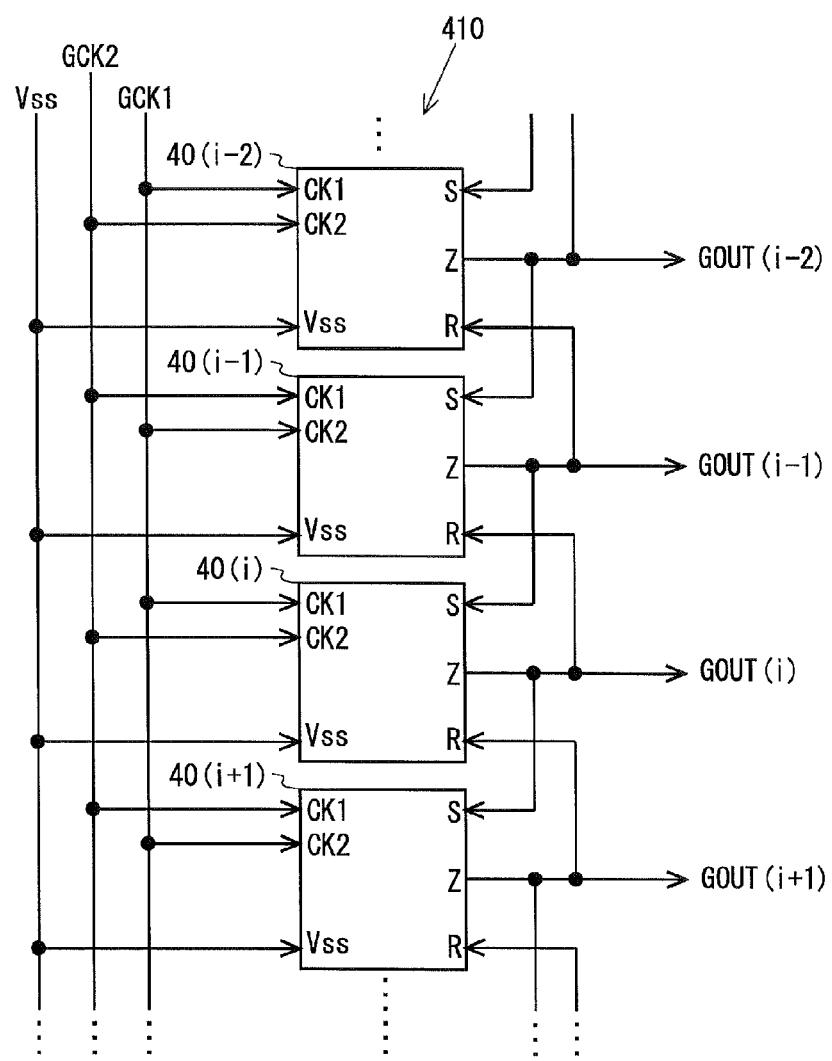
FIG. 3 is a block diagram illustrating the configuration of a gate shift register in the first embodiment.
Figure 4:
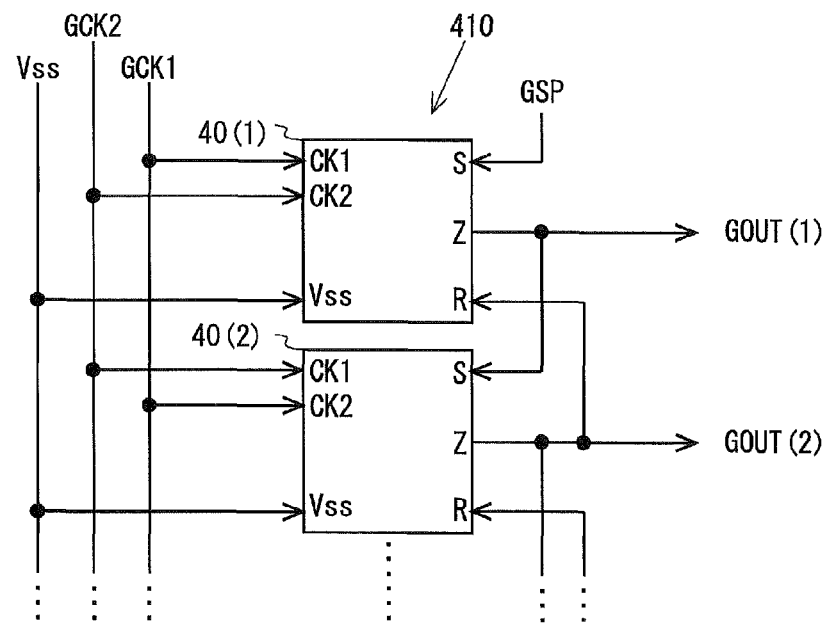
FIG. 4 is a block diagram illustrating the configuration of a portion of the gate shift register in the first embodiment, including the first-row stage.
Figure 5:
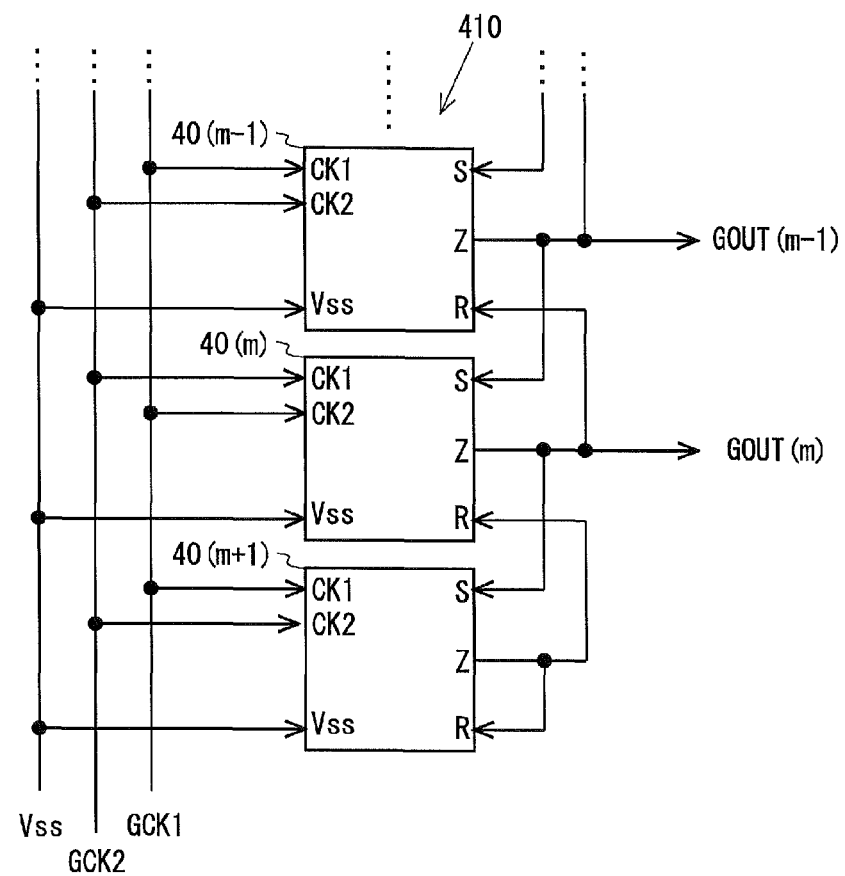
FIG. 5 is a block diagram illustrating the configuration of a portion of the gate shift register in the first embodiment, including the last-row stage.

FIG. 3 is a block diagram illustrating the configuration of the gate shift register 410 in the present embodiment, excluding the first-row stage and the last-row stage. FIG. 4 is a block diagram illustrating the configuration of a portion of the gate shift register 410 in the present embodiment, including the first-row stage. FIG. 5 is a block diagram illustrating the configuration of a portion of the gate shift register 410 in the present embodiment, including the last-row stage. Note that in the following, an x'th-stage (where x=1 to m+1) bistable circuit will also be referred to simply as an "x'th-stage". The shift register 410 consists of the m gate bistable circuits 40(1) to 40(*m*) and the dummy gate bistable circuit 40(*m*+1), as described above. FIG. 3 shows the $(i-2)$'th to $(i+1)$'th stages 40$(i-2)$ to 40$(i+1)$, FIG. 4 shows the first and second stages 40(1) and 40(2), and FIG. 5 shows the $(m-1)$'th and m'th stages 40$(m-1)$ and 40$(m)$ as well as the dummy stage 40$(m+1)$.

Each gate bistable circuit is provided with an input terminal for receiving a clock signal CK1 (referred to below as a "first clock signal"), an input terminal for receiving a clock signal CK2 (referred to below as a "second clock signal"), an input terminal for receiving a low-level direct-current power source potential Vss (the magnitude of the potential will also be referred to as the aforementioned "Vss potential"), an input terminal for receiving a set signal S, an input terminal for receiving a reset signal R, and an output terminal for outputting a state signal Z.

The gate shift register 410 is provided with two phases of a gate clock signal GCK, i.e., first and second gate clock signals GCK1 and GCK2, as described above.

The following signals are provided to the input terminals of the stages (gate bistable circuits) in the gate shift register 410. Note that it is assumed below that i is an odd number, and m is an even number. The first gate clock signal GCK1 is provided to each odd stage as a first clock signal CK1, and the second gate clock signal GCK2 as a second clock signal CK2, as shown in FIGS. 3 to 5. The first gate clock signal GCK1 is provided to each even stage as a second clock signal CK2, and the second gate clock signal GCK2 as a first clock signal CK1. Moreover, each stage is commonly provided with a low-level direct-current power source potential Vss.

Each stage is provided with a state signal Z outputted by its preceding stage as a set signal S, and a state signal Z outputted by its following stage as a reset signal R. However, the first stage (first-row stage) 40(1) is provided with a gate start pulse signal GSP as a set signal S. Moreover, the m'th stage (last-row stage) 40(m) is provided with a state signal outputted by the dummy stage 40(m+1) as a reset signal R. Note that the dummy stage 40(m+1) is provided with a state signal Z outputted by the m'th stage 40(m) as a set signal S, and a reset signal R provided to the dummy stage 40(m+1) is a state signal Z outputted by itself. Accordingly, the period in which the state signal Z is kept at a high-level potential is shorter for the dummy stage 40(m+1) than for the other stages. Instead of providing the dummy stage 40(m+1), the m'th stage 40(m) may be provided with a gate end pulse signal GEP as a reset signal R. The gate end pulse signal is a signal that is set at a high-level potential during one horizontal scanning period after a scanning period T1.

Figure 6:
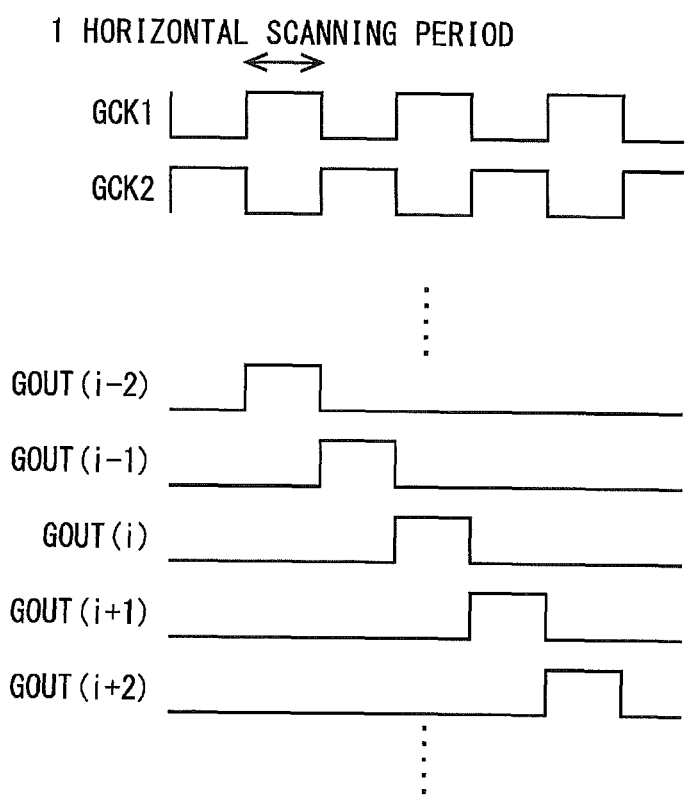
FIG. 6 is a signal waveform diagram describing the operation of the gate driver in the first embodiment.

In the configuration as above, once the gate start pulse signal GSP is provided to the first stage 40(1) of the gate shift register 410 as a set signal S, pulses included in the gate start pulse signal GSP (the pulses being included in the state signals Z outputted by any stages) are transferred sequentially from the first stage 40(1) to the m'th stage 40(m) in accordance with the first and second gate clock signals GCK1 and GCK2. Thereafter, in response to the pulse transfer, the state signals Z respectively outputted by the first to m'th stages 40(1) to 40(m) are sequentially set to a high-level potential. The state signals Z respectively outputted by the first to m'th stages 40(1) to 40(m) are provided to the gate lines $GL_1$ to $GL_m$, respectively, as scanning signals GOUT(1) to GOUT (m). Note that the state signals Z respectively outputted by the first to m'th stages 40(1) to 40(m) may be increased in voltage by level shifters before they are provided to the gate lines $GL_1$ to $GL_m$ as the scanning signals GOUT(1) to GOUT(m). In this manner, scanning signals that are sequentially set at a high-level potential for one horizontal scanning period each are provided to the gate lines in the display portion 600, as shown in FIG. 6.

<1.3 Configuration of the Gate Bistable Circuit>

Figure 7:
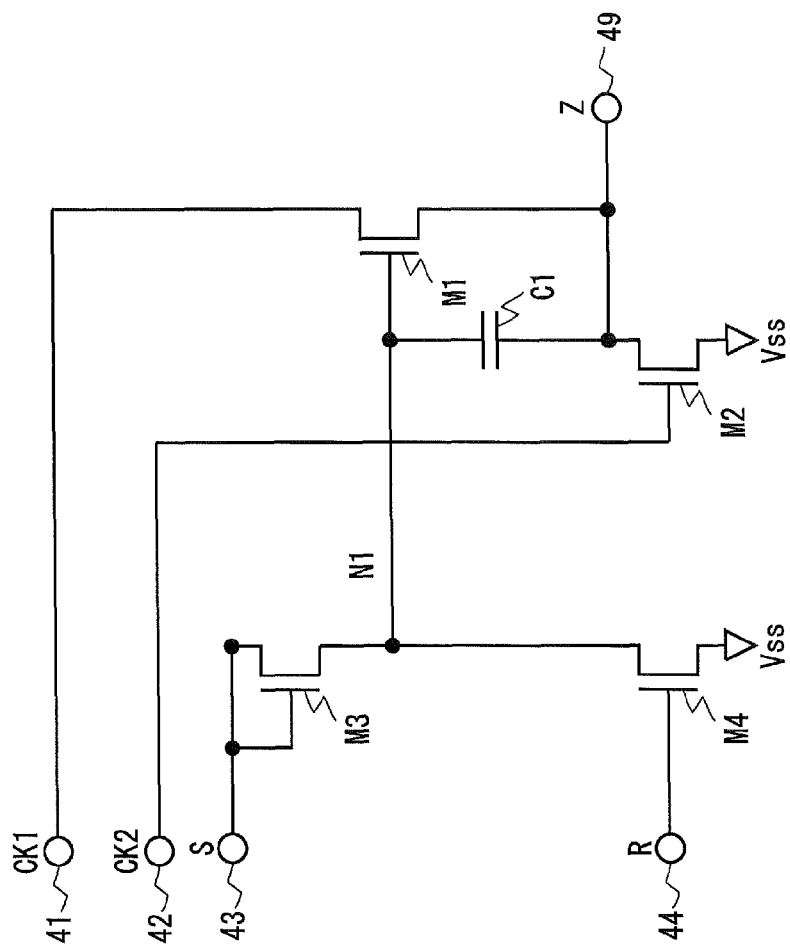
FIG. 7 is a circuit diagram illustrating the configuration of a gate bistable circuit or a CS bistable circuit in the first embodiment.

FIG. 7 is a circuit diagram illustrating the configuration of the gate bistable circuit in the present embodiment. Note that the configuration of the CS bistable circuit to be described later is similar to the configuration of the gate bistable circuit shown in FIG. 7. The bistable circuit includes four thin-film transistors (switching elements) M1 to M4, a capacitor (capacitance element) C1, four input terminals 41 to 44, an input terminal for a low-level direct-current power source potential Vss, and an output terminal 49, as shown in FIG. 7. Here, the input terminal for receiving the first clock signal CK1 is denoted by the numeral 41, the input terminal for receiving the second clock signal CK2 is denoted by the numeral 42, the input terminal for receiving the set signal S is denoted by the numeral 43, and the input terminal for receiving the reset signal R is denoted by the numeral 44. In addition, the output terminal for outputting the state signal Z is denoted by the numeral 49.

Next, the connections between components of the bistable circuit will be described. A gate terminal of the thin-film transistor M1, a source terminal of the thin-film transistor M3, a drain terminal of the thin-film transistor M4, and one terminal of the capacitor C1 are connected to one another. The connecting point (line) that connects them will be referred to below as the "first node" for convenience. The first node is denoted by the symbol N1.

The thin-film transistor M1 is connected at the gate terminal to the first node N1, at a drain terminal to the input terminal 41, and at a source terminal to the output terminal 49. The thin-film transistor M2 is connected at a gate terminal to the input terminal 42, at a drain terminal to the output terminal 49, and at a source terminal to the input terminal for the direct-current power source potential Vss. The thin-film transistor M3 is connected at gate and drain terminals to the input terminal 43 (i.e., diode-connected) and at the source terminal to the first node N1. The thin-film transistor M4 is connected at a gate terminal to the input terminal 44, at the drain terminal to the first node N1, and at a source terminal to the input terminal for the direct-current power source potential Vss. The capacitor C1 is connected at one terminal to the first node N1 and at the other terminal to the output terminal 49.

Next, the function of each component of the gate bistable circuit will be described. The thin-film transistor M1 provides the potential of the first clock signal CK to the output terminal 49 when the potential of the first node N1 is at high level. The thin-film transistor M2 changes the potential of the output terminal 49 toward the Vss potential when the potential of the second clock signal CK2 is at high level. The thin-film transistor M3 changes the potential of the first node N1 toward high level when the potential of the set signal S is at high level. The thin-film transistor M4 changes the potential of the first node N1 toward the Vss potential when the potential of the reset signal R is at high level. The capacitor C1 functions as an auxiliary capacitor when the first node N1 is bootstrapped.

<1.4 Operation of the Gate Bistable Circuit>

Figure 8:
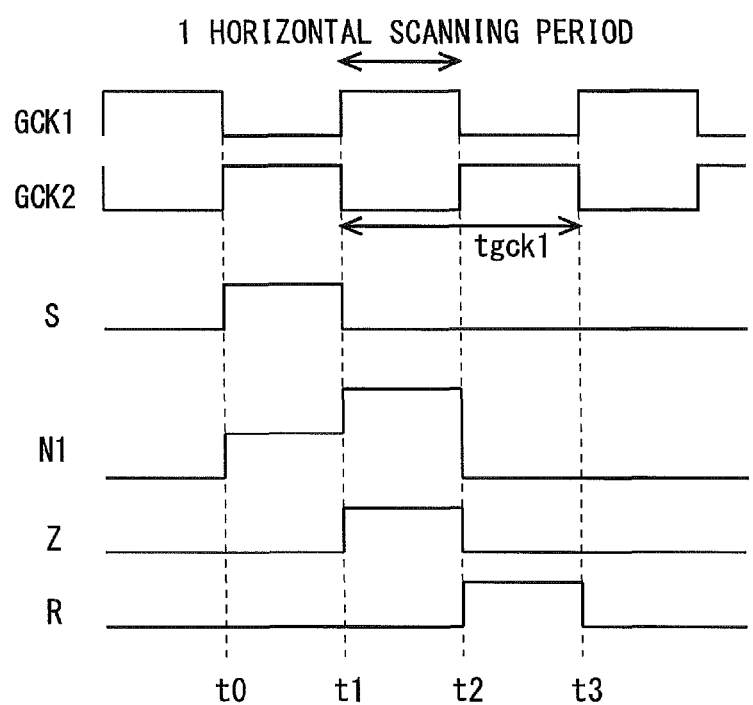
FIG. 8 is a signal waveform diagram describing the operation of the gate bistable circuit in the first embodiment during a scanning period.

FIG. 8 is a signal waveform diagram describing the operation of the i'th-stage gate bistable circuit 40(i) in the present embodiment, particularly focusing on the operation during the scanning period T1 to be described later. Note that the operation of the other gate bistable circuits is similar, and therefore, any descriptions thereof will be omitted. For the i'th stage, the first and second gate clock signals GCK1 and GCK2 correspond to the first and second clock signals CK1 and CK2, respectively. In FIG. 8, the period from time t1 to time t2 corresponds to a selection period. In the following, the period from the rise of the gate start pulse signal GSP (scanning start time) to the rise of the dummy-stage scanning signal GOUT(m+1) within one frame period will be referred to as the "scanning period", and is denoted by the symbol T1. The scanning period T1 is a period in which a plurality (m) of gate lines GL(1) to GL(m) are scanned once. Moreover, the period from the rise of the dummy-stage scanning signal GOUT(m+ 1) to the rise of the gate start pulse signal GSP during the following frame period within one frame period will be referred to as the "idle period", and is denoted by the symbol T2. The idle period T2 is a period in which output signals from all of the gate bistable circuits 40(1) to 40(m), excluding the dummy stage 40(m+1), are set at a low-level potential. In the descriptions of the operation during the scanning period T1, one horizontal scanning period immediately before the selection period will be referred to as a "set period", and one horizontal scanning period immediately after the selection period will be referred to as a "reset period". In addition, the rest of the scanning period T1 other than the selection period, the set period, and the reset period will be referred to as a "normal operation period".

Once the set period arrives (at time t0), the potential of the set signal S changes from low to high level. Since the thin-film transistor M3 is diode-connected as shown in FIG. 7, when the potential of the set signal S is set to high level, the thin-film transistor M3 is brought into on-state, so that the capacitor C1 is charged (in this case, precharged). As a result, the potential of the first node N1 changes from low to high level, so that the thin-film transistor M1 is brought into on-state. However, during the set period, the potential of the first gate clock signal GCK1 (first clock signal CK1) is at low level, and therefore, the potential of the state signal Z is maintained at low level.

Once the selection period arrives (at time t1 ), the set signal S changes from high to low level. As a result, the thin-film transistor M3 is brought into off-state. At this time, the first node N1 is brought into floating state. At time t1 , the potential of the first gate clock signal GCK1 changes from low to high level. Since the thin-film transistor M1 is in on-state, and there is gate capacitance, the potential of the first node N1 rises with the potential of the input terminal 41 (i.e., the first node N1 is bootstrapped). In this case, the capacitor C1 serves to promote a rise in the potential of the first node N1. As a result, the gate potential of the thin-film transistor M1 increases to a sufficiently high degree, so that the potential of the state signal Z rises to the high level (Vdd potential) of the first gate clock signal GCK1.

Once the reset period arrives (at time t2), the potential of the first gate clock signal GCK1 changes from high to low level. At time t2, since the thin-film transistor M1 is in on-state, the potential of the state signal Z decreases with the potential of the input terminal 41. Such a decrease in the potential of the state signal Z causes the potential of the first node N1 to decrease through the capacitor C1. Moreover, during the reset period, the reset signal R changes from low to high level. Accordingly, the thin-film transistor M4 is brought into on-state. As a result, it is ensured that during the reset period, the potential of the first node N1 falls to low level. Moreover, during the reset period, the second gate clock signal GCK2 (second clock signal CK2) changes from low to high level. Accordingly, the thin-film transistor M2 is brought into on-state, so that it is ensured that the potential of the state signal Z falls to low level.

During the normal operation period (consisting of a section before time t0 and a section after time t3 during the scanning period T1), the potential of the second gate clock signal GCK2 alternates between high and low levels every horizontal scanning period, so that the thin-film transistor M2 is brought into on-state every horizontal scanning period. Therefore, the potential of the state signal Z can be maintained at low level.

Note that in the following, the cycle of each of the first and second gate clock signals GCK1 and GCK2 during the scanning period T1 (referred to below as the "scanning-period gate cycle") will be denoted by the symbol tgck1. In addition, the frequency of each of the first and second gate clock signals GCK1 and GCK2 during the scanning period T1 (referred to below as the "scanning-period gate frequency") will be denoted by the symbol fgck1.

<1.6 Configuration and Operation of the CS Driver>

In the present embodiment, the CS driver 500 consists of a CS shift register 510 and a CS output portion 520, as shown in FIG. 2. In the present embodiment, the gate driver 400 and the CS driver 500 are disposed on opposite sides of the display portion 600. The CS shift register 510 consists of m (stages of) CS bistable circuits 50(1) to 50(m) and one (stage of) dummy CS bistable circuit 50(m+1) (also referred to below as a "dummy stage"). The display portion 600 has the pixel matrix of m rows×n columns formed thereon, as described above, and the CS bistable circuits are provided in stages in one-to-one correspondence with the rows of the pixel matrix. The CS bistable circuits 50(1) to 50(m) are connected to the CS output portion 520. The CS output portion 520 is connected to the CS lines $CL_1$ to $CL_m$. In the present embodiment, the CS shift register 510 realizes a first shift register, and the CS bistable circuits realize first bistable circuits.

<1.6.1 Configuration and Operation of the CS Shift Register>

Figure 9:
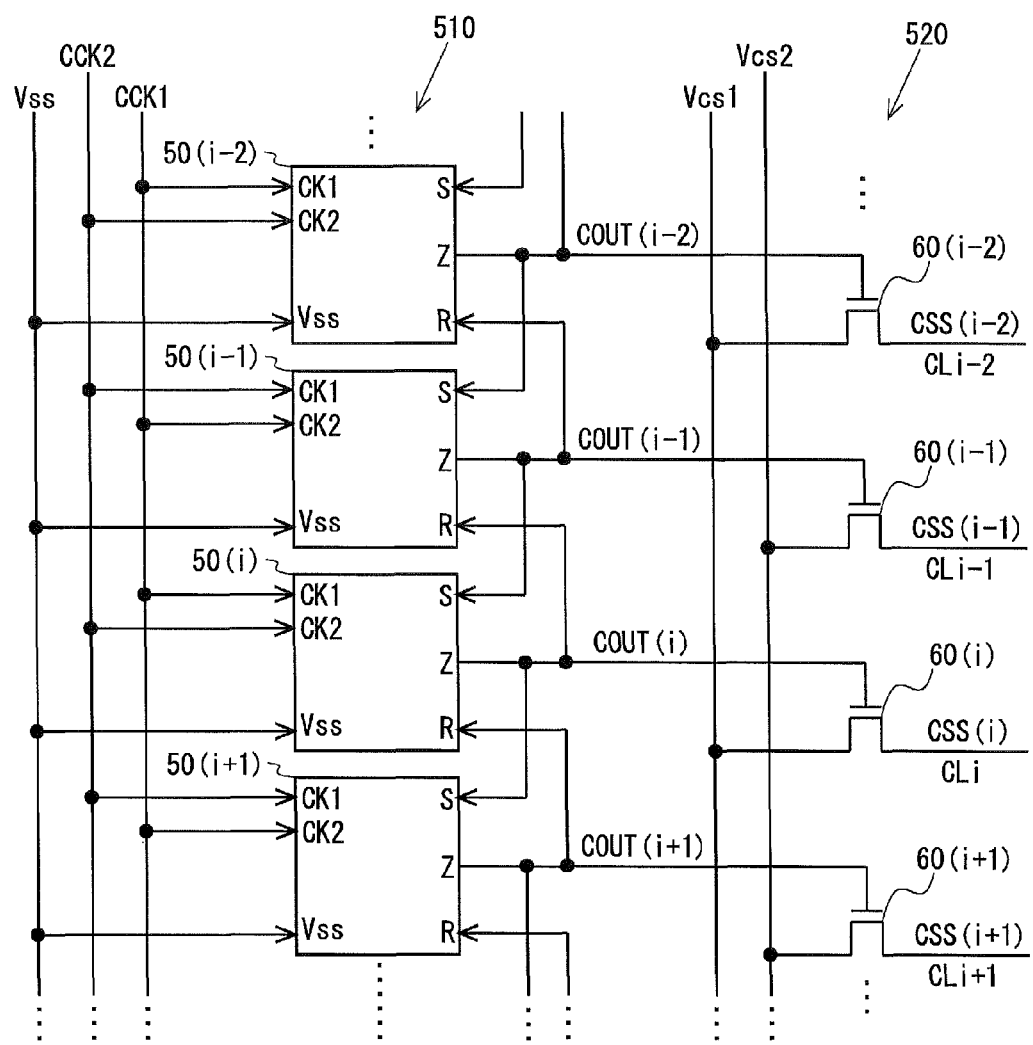
FIG. 9 is a block diagram illustrating the configuration of the CS driver in the first embodiment.
Figure 10:
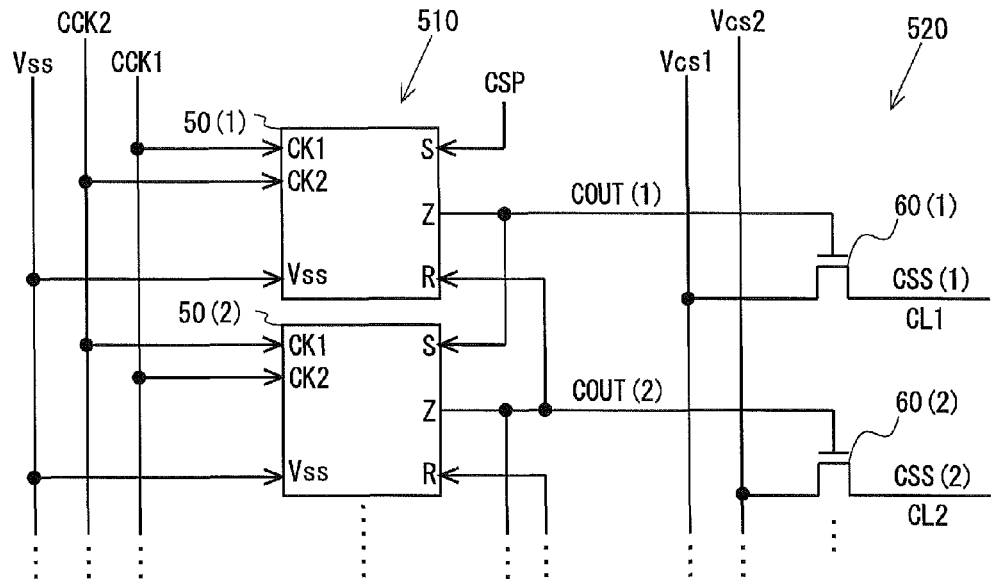
FIG. 10 is a block diagram illustrating the configuration of a portion of the CS driver in the first embodiment, including the first-row stage.
Figure 11:
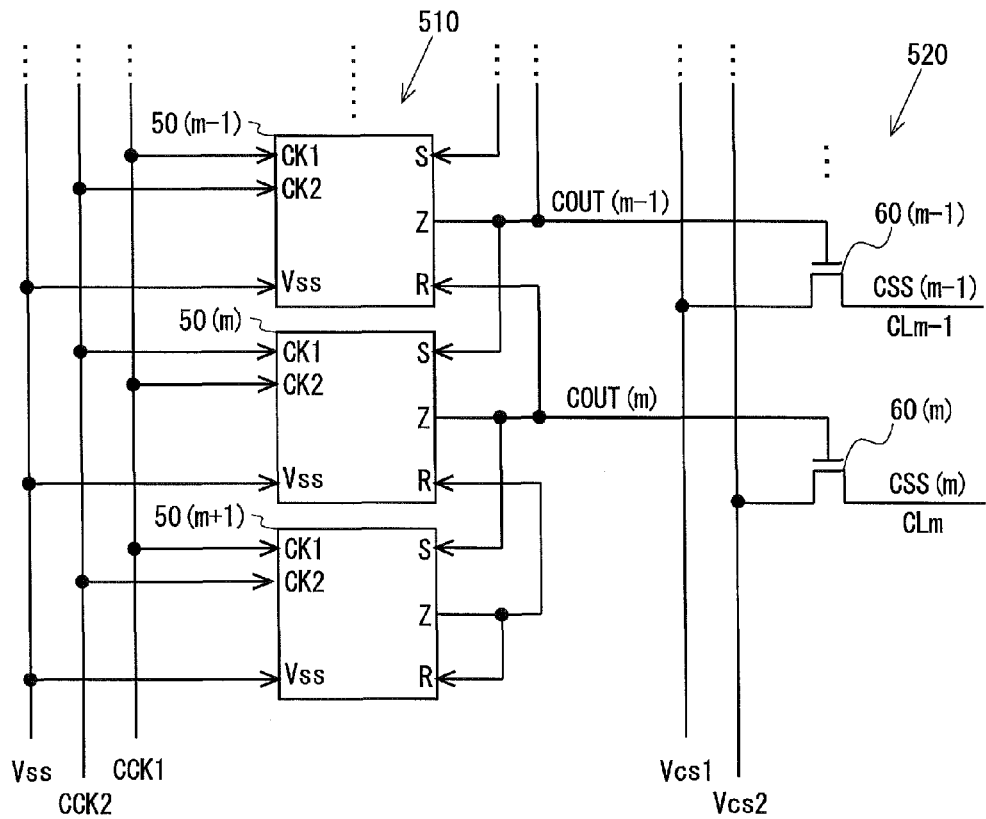
FIG. 11 is a block diagram illustrating the configuration of a portion of the CS driver in the first embodiment, including the last-row stage.

FIG. 9 is a block diagram illustrating the configuration of the CS driver 500 in the present embodiment, excluding the first- and last-row stages. FIG. 10 is a block diagram illustrating the configuration of a portion of the CS driver 500 in the present embodiment, including the first-row stage. FIG. 11 is a block diagram illustrating the configuration of a portion of the CS driver 500 in the present embodiment, including the last-row stage. As described above, the configuration of the CS bistable circuits is similar to the configuration of the gate bistable circuits. Therefore, any descriptions of common points with the gate bistable circuits will be omitted.

However, the CS bistable circuits differ from the gate bistable circuits with respect to signals provided to the input terminals 41 and 42 for receiving the first and second clock signals, respectively. Specifically, as shown in FIGS. 9 to 11, for odd stages, the first CS clock signal CCK1 is provided as a first clock signal CK1, and the second CS clock signal CCK2 is provided as a second clock signal CK2. For even stages, the first CS clock signal CCK1 is provided as a second clock signal CK2, and the second CS clock signal CCK2 is provided as a first clock signal CK1.

Furthermore, the CS start pulse signal CSP is provided to the first stage (first-row stage) 50(1) as a set signal S, as shown in FIG. 10. The CS start pulse signal CSP is a signal that is set at a high-level potential during one horizontal scanning period immediately after a horizontal scanning period in which the gate start pulse signal GSP is at a high-level potential, and also during one horizontal scanning period immediately after the start of an idle period T2.

Figure 12:
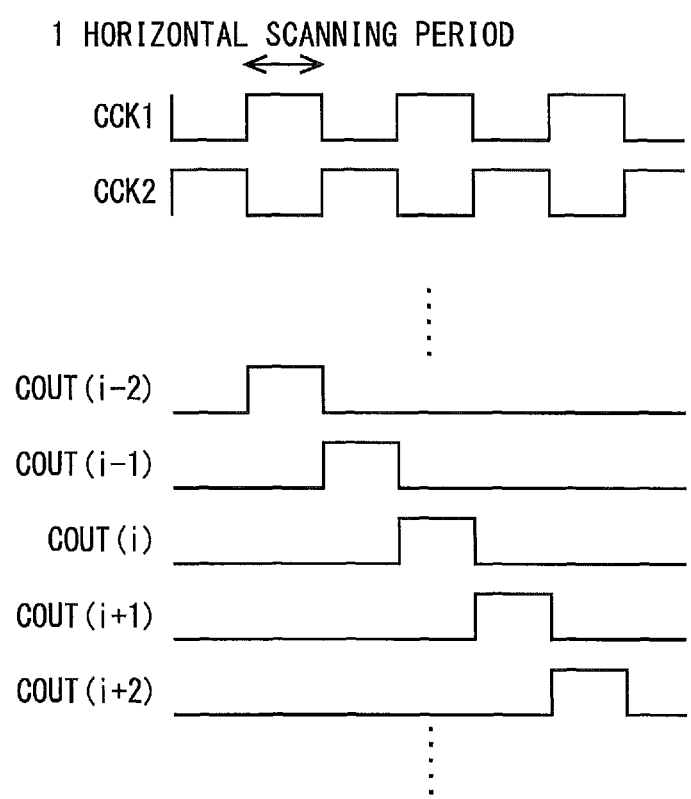
FIG. 12 is a signal waveform diagram describing the operation of a CS shift register in the first embodiment.

In the configuration as above, once the CS start pulse signal CSP is provided to the first stage 40(1) of the CS shift register 510 as a set signal S, pulses included in the CS start pulse signal CSP (the pulses being included in the state signals Z outputted by any stages) are transferred sequentially from the first stage 40(1) to the m'th stage 40(m) in accordance with the first and second CS clock signals CCK1 and CCK2. Thereafter, in response to the pulse transfer, the state signals Z respectively outputted by the first to m'th stages 40(1) to 40(m) are sequentially set to a high-level potential. The state signals Z respectively outputted by the first to m'th stages 40(1) to 40(m) are provided to the CS output portion 520 as control signals COUT(1) to COUT(m). More specifically, the control signals COUT(1) to COUT(m) are provided to gate terminals of bias thin-film transistors (first switching elements) 60(1) to 60(m) to be described later, which are included in the CS output portion 520. Thus, control signals that are sequentially set at a high-level potential for one horizontal scanning period each are provided to the CS output portion 520, as shown in FIG. 12.

<1.6.2 Operation of the CS Bistable Circuits>

Figure 13:
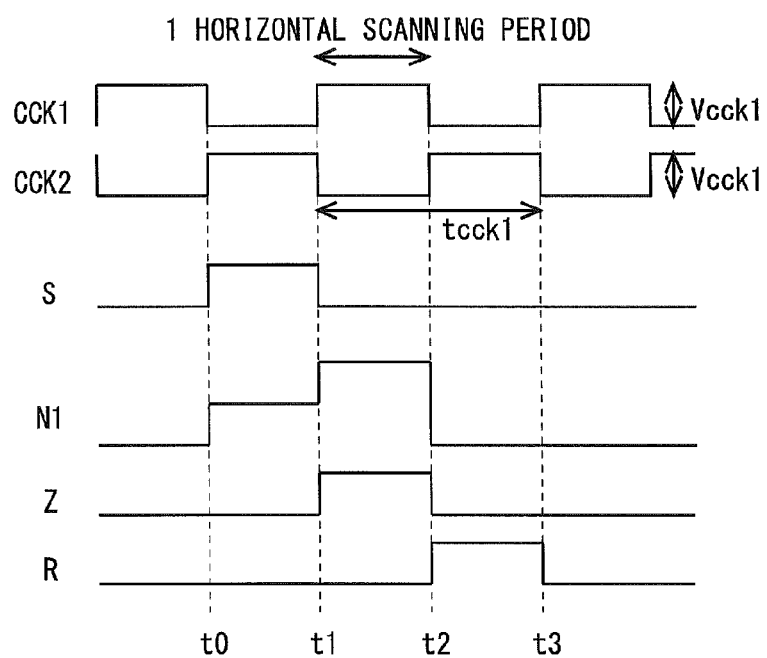
FIG. 13 is a signal waveform diagram describing the operation of the CS bistable circuit in the first embodiment during the scanning period.

FIG. 13 is a signal waveform diagram describing the operation of the i'th-stage CS bistable circuit 50(i) in the present embodiment, particularly focusing on the operation during the scanning period T1. The operation of the CS bistable circuits differs from the operation of the gate bistable circuits, in that the first and second CS clock signals CCK1 and CCK2 are provided in place of the first and second gate clock signals GCK1 and CCK2, as shown in FIG. 13, and therefore, the operation of the CS bistable circuits during the scanning period T1 will not be described in detail.

Note that in the following, the cycle of each of the first and second CS clock signals CCK1 and CCK2 during the scanning period T1 (referred to below as the "scanning-period CS cycle") will be denoted by the symbol tcck1. In addition, the frequency of each of the first and second CS clock signals CCK1 and CCK2 during the scanning period T1 (referred to below as the "scanning-period CS frequency") will be denoted by the symbol fcck1. Further, the amplitude of each of the first and second CS clock signals CCK1 and CCK2 during the scanning period T1 (referred to below as the "scanning-period CS amplitude") will be denoted by the symbol Vcck1.

<1.6.3 Configuration and Operation of the CS Output Portion>

In the present embodiment, the CS output portion 520 consists of m bias thin-film transistors (first switching elements) 60(1) to 60(m), as shown in FIGS. 9 to 11. The bias thin-film transistors 60(1) to 60(m) correspond to the CS bistable circuits 50(1) to 50(m), respectively, and also correspond to the CS lines $CL_1$ to $CL_m$, respectively. Each bias thin-film transistor is connected at a gate terminal to the output terminal 49 of its corresponding CS bistable circuit (the terminal from which the state signal Z is outputted), and at a drain terminal to its corresponding CS line. Moreover, each odd-stage bias thin-film transistor is provided with a first bias signal Vcs1 at a source terminal, and each even-stage bias thin-film transistor is provided with a second bias signal Vcs2 at a source terminal. Note that depending on the potentials of the CS line (auxiliary capacitance signal), the first bias signal Vcs1, and the second bias signal Vcs2, the source terminal and the drain terminal of each bias thin-film transistor replace each other. However, descriptions herein are based on the assumption that, regardless of these potentials, the terminal of each bias thin-film transistor that is connected to its corresponding CS line is the drain terminal, and the terminal of each bias thin-film transistor to which the first or second bias signal Vcs1 or Vcs2 is provided is the source terminal.

Figure 14:
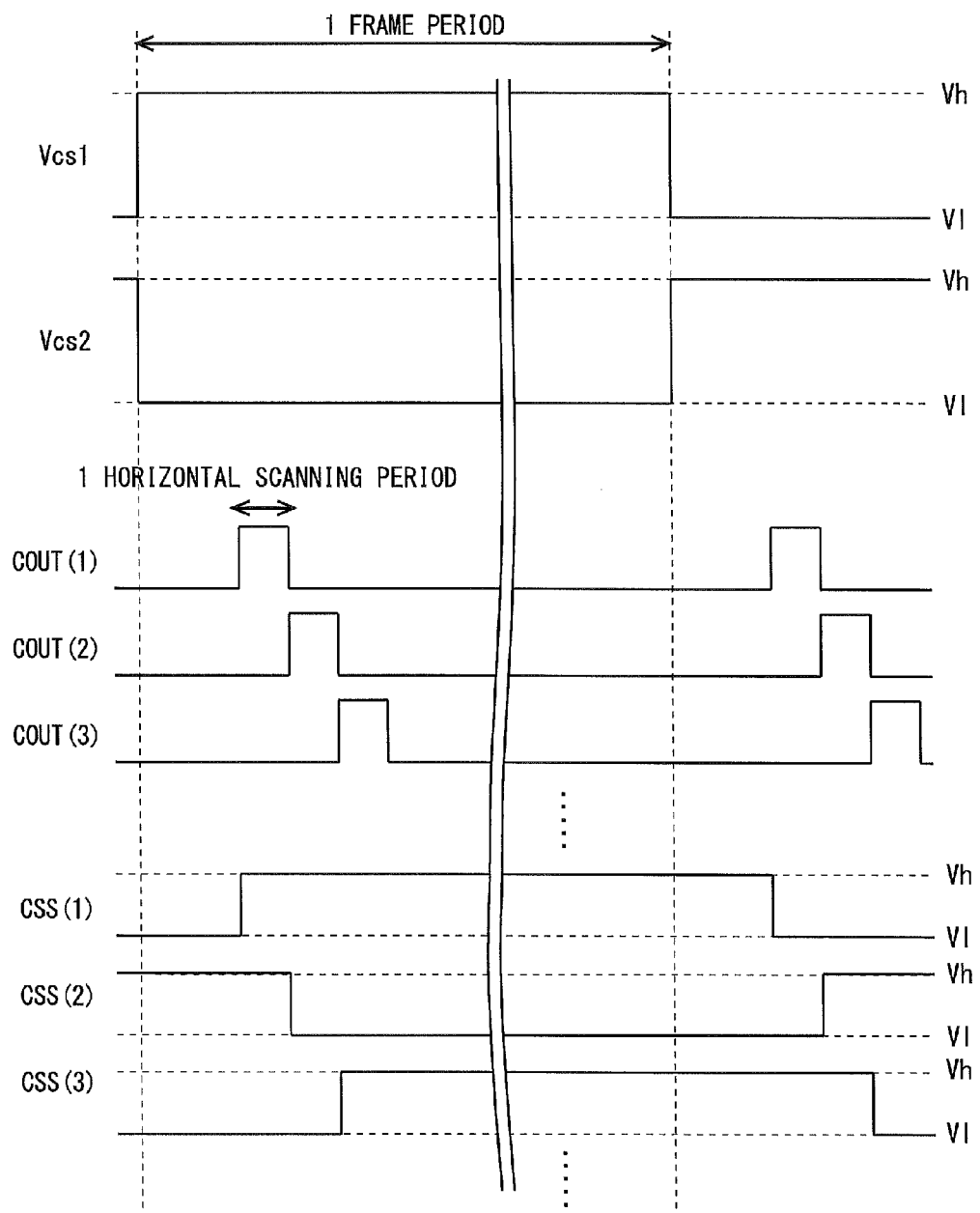
FIG. 14 is a signal waveform diagram describing the operation of a CS output portion in the first embodiment during the scanning period.

FIG. 14 is a signal waveform diagram describing the operation of the CS output portion 520 in the present embodiment, particularly focusing on the operation during the scanning period T2. The first bias signal Vcs1 and the second bias signal differ in potential from each other, and have their potentials inverted every frame period, as shown in FIG. 14. Specifically, for example, during the first of two consecutive frame periods, the potential of the first bias signal Vcs1 is a predetermined high potential Vh (referred to below simply as a "high potential Vh"), and the potential of the second bias signal Vcs2 is a predetermined low potential Vl (referred to below simply as a "low potential Vl"); during the second frame period, the potential of the first bias signal Vcs1 is the low potential Vl, and the potential of the second bias signal Vcs2 is the high potential Vh.

It is assumed that initially, the potential of the first bias signal Vcs1 is the high potential Vh, and the potential of the second bias signal Vcs2 is the low potential Vl. Once the control signal COUT(1), which is an output signal from the first-stage CS bistable circuit 50(1), is set to a high-level potential, the corresponding bias thin-film transistor 60(1) is brought into on-state. Since the first bias signal Vcs1 is provided to the source terminal of the bias thin-film transistor 60(1), the potential of the auxiliary capacitance signal CSS(1) applied to the CS line (1) changes to the high potential Vh. The potential of the auxiliary capacitance signal CSS(1) is maintained until the bias thin-film transistor 60(1) is brought into on-state during the second frame period.

Next, once the control signal COUT(2), which is an output signal from the second-stage CS bistable circuit 50(2), is set to a high-level potential, the corresponding bias thin-film transistor 60(2) is brought into on-state. Since the second bias signal Vcs2 is provided to the source terminal of the bias thin-film transistor 60(2), the potential of the auxiliary capacitance signal CSS(2) applied to the CS line (2) changes to the low potential Vl. The potential of the auxiliary capacitance signal CSS(2) is maintained until the bias thin-film transistor 60(2) is brought into on-state during the second frame period.

Next, once the control signal COUT(3), which is an output signal from the third-stage CS bistable circuit 50(3), is set to a high-level potential, the corresponding bias thin-film transistor 60(3) is brought into on-state. Since the first bias signal Vcs1 is provided to the source terminal of the bias thin-film transistor 60(3), the potential of the auxiliary capacitance signal CSS(3) applied to the CS line (3) changes to the high potential Vh. The potential of the auxiliary capacitance signal CSS(3) is maintained until the bias thin-film transistor 60(3) is brought into on-state during the second frame period. Thereafter, the potential of each of the auxiliary capacitance signals applied to the CS lines changes sequentially as well in accordance with control signals, which are output signals from the CS bistable circuits.

<1.7 Changes in Pixel Potential>

Figure 15:
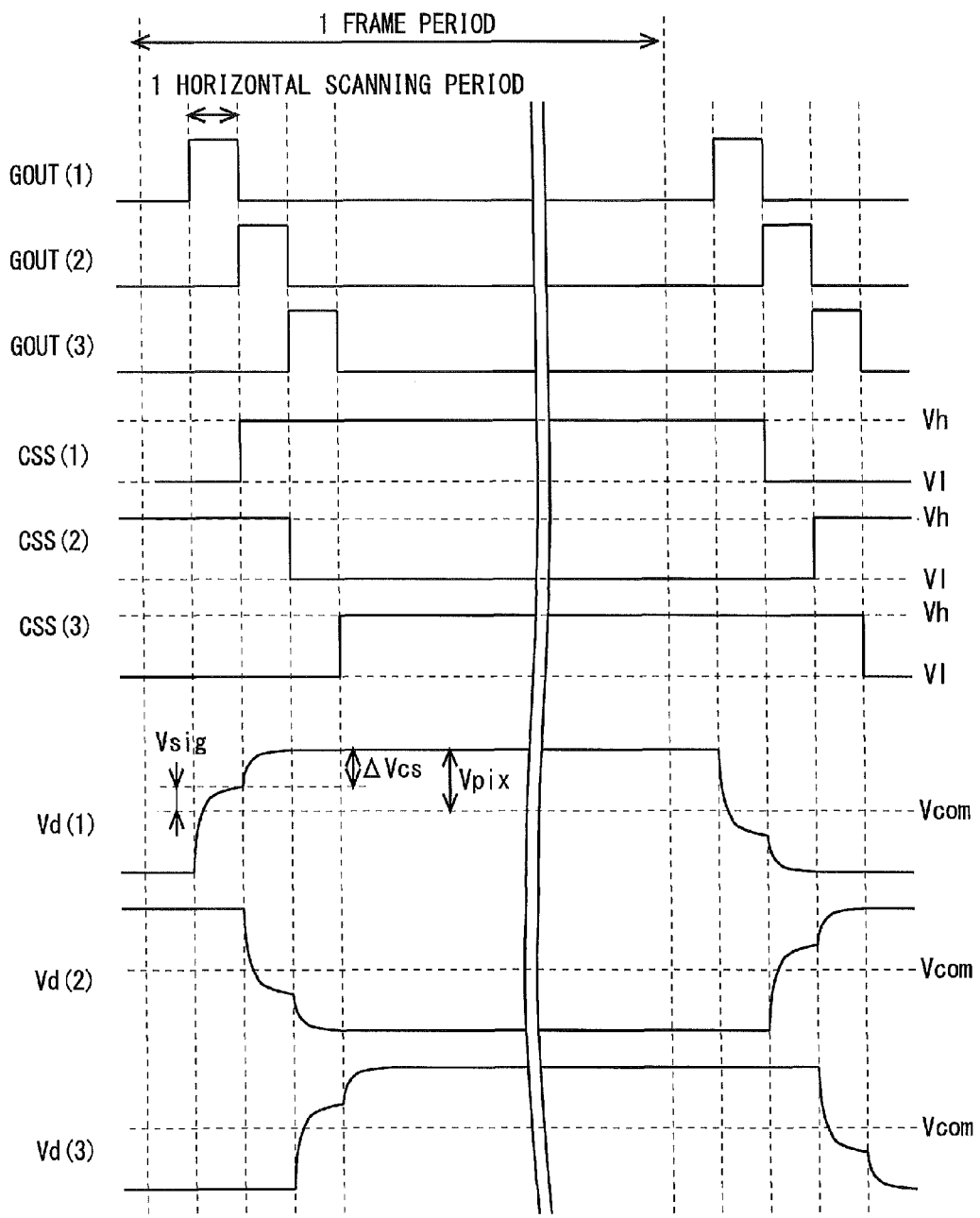
FIG. 15 is a signal waveform diagram describing changes in pixel potential in the first embodiment.

FIG. 15 is a signal wave form diagram describing changes in pixel potential in the present embodiment. In the present embodiment, line-inversion drive in which the polarity of pixel potentials is inverted row-by-row is performed. Note that the following description is based on the assumption that the polarity of pixel potentials is inverted every row, but the polarity of pixel potentials may be inverted every multiple rows. In FIG. 15, Vd(1) to Vd(3) denote pixel potentials Vd for pixel forming portions arbitrarily selected from among the pixel forming portions provided corresponding to the gate lines $GL_1$ to $GL_3$. In the following, the pixel potentials Vd(1), Vd(2), and Vd(3) will be referred to as the "first-row pixel potential", the "second-row pixel potential", and the "third-row pixel potential", respectively.

Once the gate line $GL_1$ is brought into selected state (i.e., once the scanning signal GOUT(1) is set to a high-level potential), the pixel thin-film transistor 80 with its gate terminal connected to the gate line $GL_1$ is brought into on-state, so that the pixel capacitor Cp is charged by a video signal provided through the pixel thin-film transistor 80. As a result, the first-row pixel potential Vd(1) becomes a write potential Vsig, as shown in FIG. 15. Then, once the scanning signal GOUT(1) is set to a low-level potential, the pixel thin-film transistor 80 is brought into off-state, so that the first-row pixel potential Vd(1) is maintained as the write potential Vsig. Up to this point, the potential of the auxiliary capacitance signal CSS(1), which is applied to the CS line $CL_1$ disposed along the gate line $GL_1$, is kept at the low potential Vl.

Next, the potential of the auxiliary capacitance signal CSS(1) changes from the low potential Vl to the high potential Vh. As a result, a bias voltage ΔVcs is applied to the first-row pixel potential Vd(1) in accordance with the change of the auxiliary capacitance signal CSS(1). Accordingly, the potential of the first-row pixel potential Vd(1) can be expressed by equation (1) below.

$$Vd(1) = Vsig + \Delta Vcs \qquad (1)$$
$$= Vsig + (Ccs/(Clc + Ccs)) \times (Vh - Vl)$$

As can be appreciated, the first-row pixel potential Vd(1) becomes greater than the write potential Vsig, which corresponds to the amplitude of the video signal, by (Ccs/(Clc+

Ccs))×(Vh−Vl). In this manner, it is possible to apply a large voltage to the liquid crystal layer while keeping a low amplitude of the video signal to be provided to the source line. Thus, low power consumption can be achieved. The first-row pixel potential Vd(1) is maintained until the pixel thin-film transistor 80 is brought back into on-state during the second frame period. Note that a similar operation to the above is performed in the second frame period, and therefore, any description thereof will be omitted. However, it should be noted that the first-row pixel potential Vd(1) during the second frame period is opposite in polarity to that during the first frame period. Moreover, as for the second- and third-row pixel potentials Vd(2) and Vd(3), similar operations to the above are performed, and therefore, any descriptions thereof will be omitted. However, it should be noted that the second-row pixel potential Vd(2) is opposite in polarity to the first-row pixel potential Vd(1).

Note that in the present embodiment, the gate lines $GL_1$ to $GL_m$ are scanned in ascending order of their numbers (i.e., "in the order: $GL_1 \rightarrow GL_2 \rightarrow \ldots \rightarrow GL_m$"), as shown in FIG. 6. Accordingly, the auxiliary capacitance signals CSS(1) to CSS (m) are changed in potential similarly in ascending order of their numbers (i.e., in the order: "CSS(1)→CSS(2)→ . . . CSS(m)"), as shown in FIG. 12. However, the present invention is not limited to the aforementioned order of scanning the gate lines $GL_1$ to $GL_m$ and the aforementioned order of changing the auxiliary capacitance signals CSS(1) to CSS(m) in potential. In the case where the gate lines $GL_1$ to $GL_m$ are scanned in descending order of their numbers (i.e., in the order: "$GL_m \rightarrow \ldots \rightarrow GL_2 \rightarrow GL_1$"), the auxiliary capacitance signals CSS(1) to CSS(m) are changed in potential similarly in descending order of their numbers (i.e., in the order: "CSS (m)→ . . . CSS(2)→CSS(1)"). Moreover, the order of scanning the gate lines $GL_1$ to $GL_m$ and the order of changing the auxiliary capacitance signals CSS(1) to CSS(m) in potential may be changeable.

<1.8 Operation During the Idle Period>

Figure 16:
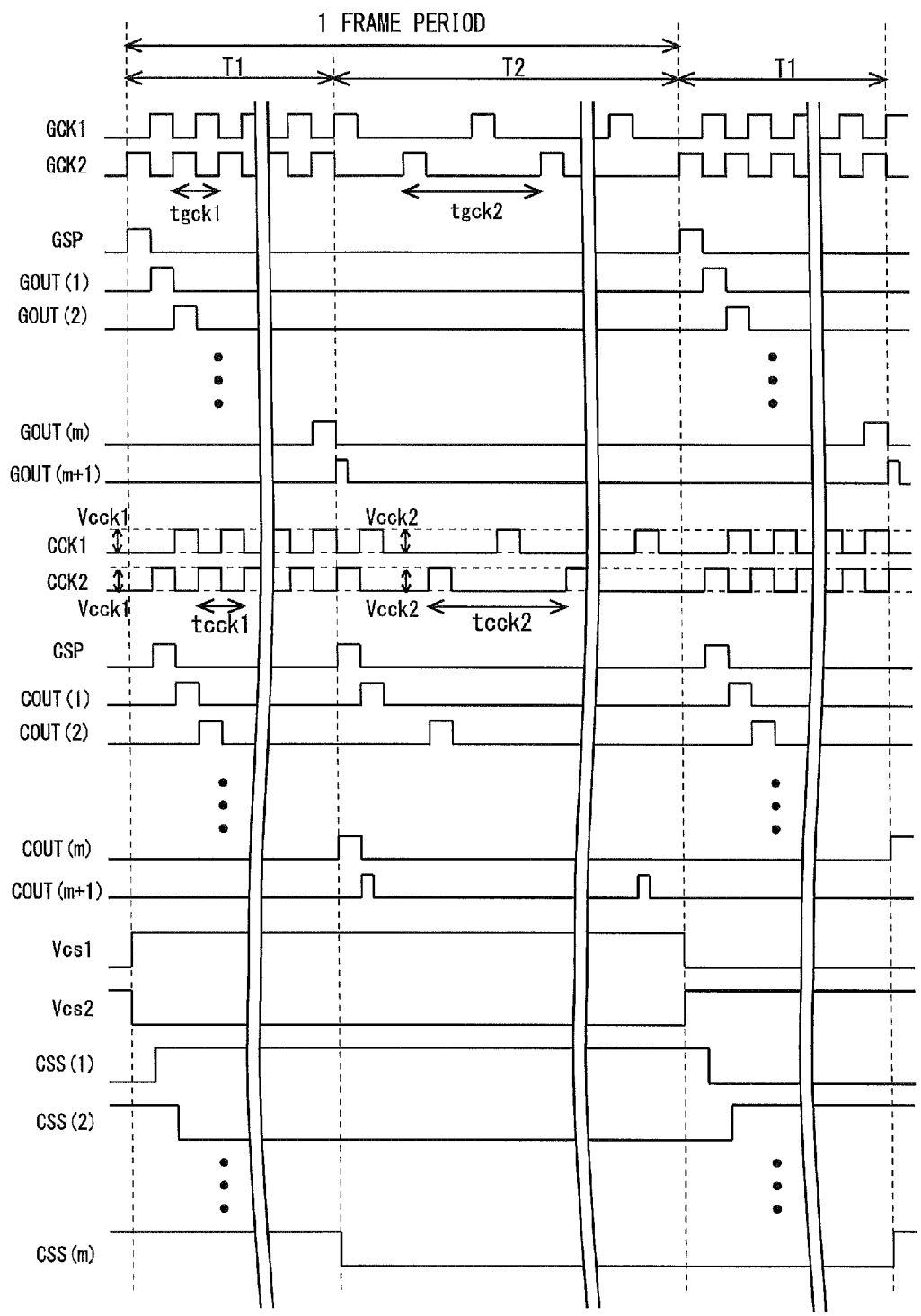
FIG. 16 is a signal waveform diagram describing the operation of the CS driver in the first embodiment during an idle period.

FIG. 16 is a signal waveform diagram describing the operation of the CS driver 500 in the present embodiment, particularly focusing on the operation during the idle period T2. In the present embodiment, one frame period consists of a scanning period T1 and an idle period T2 following the scanning period T1, as shown in FIG. 16. That is, the scanning period T1 and the idle period T2 alternatingly occur in cycles of one frame period. Before describing the operation of the CS driver 500, the operation of the gate driver 400 will be described first. Here, the cycle of each of the first and second gate clock signals GCK1 and GCK2 during the idle period T2 (referred to below as the "idle-period gate cycle") will be denoted by the symbol tgck2. In addition, the frequency of each of the first and second gate clock signals GCK1 and GCK2 during the idle period T2 (referred to below as the "idle-period gate frequency") will be denoted by the symbol fgck2.

In the present embodiment, the idle period T2 is set longer than the scanning period T1. However, the present invention is not limited to this, and the idle period T2 may be shorter than the scanning period T1.

During the scanning period T1, the gate driver 400 is driven at the scanning-period gate frequency fgck1, and the scanning signals GOUT(1) to GOUT(m), which are state signals Z respectively outputted by the first to m'th stages 40(1) to 40(*m*), are sequentially set to a high-level potential in accordance with the first and second gate clock signals GCK1 and GCK2. On the other hand, during the idle period T2, the gate driver 400 is driven at the idle-period gate frequency fgck2 lower than the scanning-period gate frequency fgck1, and the scanning signals GOUT(1) to GOUT(m) are maintained at a low-level potential. That is, during the idle period T2, all of the gate lines $GL_1$ to $GL_m$ are set in unselected state. Through the above operation, power consumption for driving the gate driver 400 can be reduced. Note that during the idle period T2, the gate clock signal GCK may be stopped from being supplied to the gate driver 400, or the gate clock signal GCK may be maintained at a low-level potential.

Next, the operation of the CS driver 500 in the present embodiment will be described. During the scanning period T1, the control signals COUT(1) to COUT(*m*−1), which are state signals Z respectively outputted by the first to (m−1)'th stages 50(1) to 50(*m*−1), are sequentially set to a high-level potential in accordance with the first and second CS clock signals CCK1 and CCK2. Note that the control signal COUT (m) is set at a high-level potential during the first horizontal scanning period within the idle period T2 following the scanning period T1.

On the other hand, during the idle period T2, the CS driver 500 operates differently compared to the operation during the scanning period T1. Here, the cycle of each of the first and second CS clock signals CCK1 and CCK2 during the idle period T2 (referred to below as the "idle-period CS cycle") will be denoted by the symbol tcck2. In addition, the frequency of each of the first and second CS clock signals CCK1 and CCK2 during the idle period T2 (referred to below as the "idle-period CS frequency") will be denoted by the symbol fcck2. Further, the amplitude of each of the first and second CS clock signals CCK1 and CCK2 during the idle period T2 (referred to below as the "idle-period CS amplitude") will be denoted by the symbol Vcck2.

The idle-period CS cycle tcck2 is longer than the scanning-period CS cycle tcck1, as shown in FIG. 16. That is, the idle-period CS frequency fcck2 is lower than the scanning-period CS frequency fcck1. Here, the scanning-period CS frequency fcck1 is desirably an integral multiple of the idle-period CS frequency fcck2. As a result, the display control circuit 200 and other components can be configured in a simplified manner. Moreover, the scanning-period CS frequency fcck1 is desirably greater than or equal to twice the idle-period CS frequency fcck2. In other words, the idle-period CS frequency fcck2 is desirably less than or equal to a half of the scanning-period CS frequency fcck1. As a result, power consumption required for driving the CS driver 500 can be reduced significantly. Such control for the frequency (cycle) of the CS clock signal CCK is performed by, for example, the display control circuit 200. The control for the frequency (cycle) of the gate clock signal GCK is also performed by, for example, the display control circuit 200. Note that in the present embodiment, the idle-period CS amplitude Vcck2 is equal in size to the scanning-period CS amplitude Vcck1.

The CS start pulse signal CSP is set at a high-level potential during the first horizontal scanning period within the idle period T2, as shown in FIG. 16. Accordingly, the control signals COUT(1) to COUT(m) are sequentially set at a high-level potential in accordance with the idle-period CS frequency fcck2 lower than the scanning-period CS frequency fcck1. In this manner, during the idle period T2 of the present embodiment, the control signals COUT(1) to COUT(m) are sequentially set to a high-level potential in longer cycles than during the scanning period T1. During the idle period T2, once the potentials of the control signals COUT(1) to COUT (m) are set to high level, the bias thin-film transistors 60(1) to 60(*m*) are brought into on-state correspondingly. During the idle period T2, the first and second bias signals Vcs1 and Vcs2 are at the same potentials as during the scanning period T1.

Therefore, there is no change in the potentials of the auxiliary capacitance signals CSS(1) to CSS(m) respectively provided to the CS lines $CL_1$ to $CL_m$.

Figure 17:
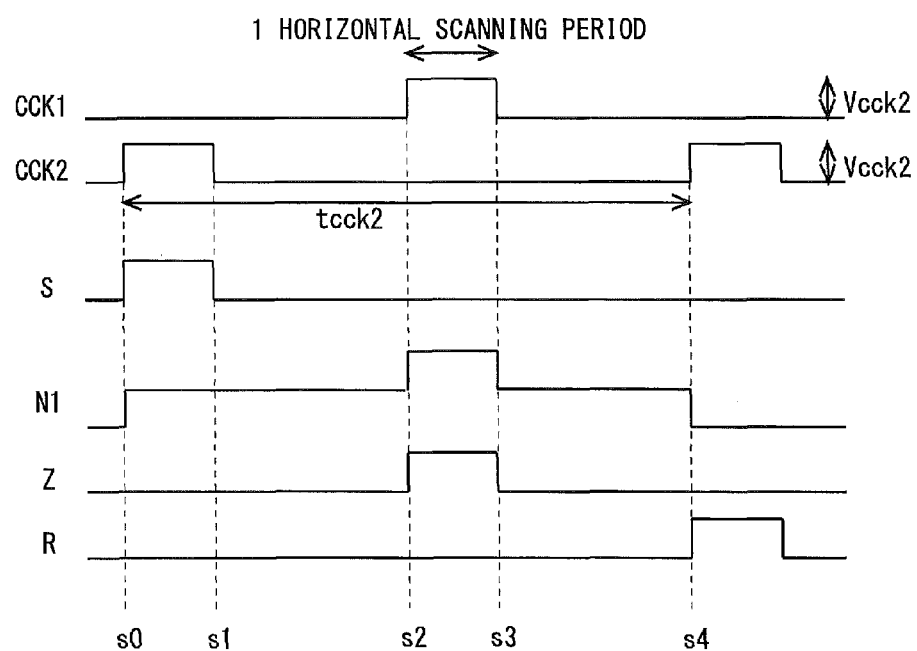
FIG. 17 is a signal waveform diagram describing the operation of the CS bistable circuit in the first embodiment during the idle period.

FIG. 17 is a signal waveform diagram describing the operation of the i'th-stage CS bistable circuit 50(i) in the present embodiment, particularly focusing on the operation during the idle period T2. Note that the other CS bistable circuits also operate in a similar manner, and therefore, any descriptions thereof will be omitted. In the description of the operation during the idle period T2, a horizontal scanning period in which the potential of a set signal S is at high level will be referred to as a "set period", a period from the end of the set period to the start of a selection period will be referred to as a "selection waiting period", a period from the end of the selection period to the time the potential of the reset signal R changes to high level will be referred to as a "reset waiting period", and a period in which the potential of the reset signal R is maintained at high level will be referred to as a "reset period". In addition, any period within the idle period T2, excluding the selection period, the set period, the selection waiting period, the reset waiting period, and the reset period, will be referred to as a "normal operation period".

The operation during the set period (from time s0 to time s1) is similar to the operation during the set period within the scanning period T1, and therefore, any description thereof will be omitted.

Once the selection waiting period arrives (at time s1), the potential of the set signal S changes from high to low level, so that the thin-film transistor M3 is brought into off-state (see FIG. 7). As a result, the first node N1 is brought into floating state. Moreover, the first CS clock signal CCK1 is maintained at the low-level potential. Accordingly, during the selection waiting period, the potential of the first node N1 is maintained the same as during the set period. Note that since the potential of the second CS clock signal CCK2 changes to low level, the thin-film transistor M2 is brought into off-state.

The operation during the selection period (from time s2 to time s3) is similar to the operation during the set period within the scanning period T1, and therefore, any description thereof will be omitted.

Once the reset waiting period arrives (at time s3), the potential of the first CS clock signal CCK1 changes from high to low level, so that the potential of the first node N1 drops because of influence of parasitic capacitance between the gate and the drain of the thin-film transistor M1. The amount of potential drop corresponds to the amount of potential rise by the aforementioned bootstrap. Accordingly, the thin-film transistor M1 is not brought into off-state. Therefore, by the potential of the first CS clock signal CCK1 changing from high to low level as described above, the potential of the state signal Z changes to low level. In addition, the potential of the first CS clock signal CCK1 is maintained at the low level thereafter as well, so that the potential of the state signal Z is maintained at the low level.

The operation during the reset period (one horizontal scanning period from time s4) is similar to the operation during the set period within the scanning period T1, and therefore, any description thereof will be omitted.

During the normal operation period (consisting of a section before time s0 and a section after time s4 within the idle period T2), the potential of the second CS clock signal CCK2 alternates between high and low levels every idle-period CS cycle tcck2, so that the thin-film transistor M2 is brought into on-state every idle-period CS cycle tcck2. Therefore, the potential of the state signal Z can be maintained at low level.

<1.9 Consideration>

An example is considered where the drive method described in Patent Document 3 is applied to a liquid crystal display device with a monolithic CS driver, which is the CS driver 500 shown in FIG. 9. In this case, to keep the CS lines $CL_1$ to $CL_m$ (auxiliary capacitance signals CSS(1) to CSS(m)) at the high potential Vh or the low potential Vl during the idle period T2, it is necessary to maintain the bias thin-film transistors 60(1) to 60(m) in off-state, or it is necessary to provide the first bias signals Vcs1 or the second bias signals Vcs2 to the CS lines $CL_1$ to $CL_m$ through the bias thin-film transistors 60(1) to 60(m) while maintaining the bias thin-film transistors 60(1) to 60(m) in on-state.

In the case where the bias thin-film transistors 60(1) to 60(m) are maintained in off-state in order to keep the CS lines $CL_1$ to $CL_m$ at the high potential Vh or the low potential Vl during the idle period T2, the CS lines $CL_1$ to $CL_m$ are brought into floating state during the idle period T2. Accordingly, during the idle period T2, the CS lines $CL_1$ to $CL_m$ become susceptible to influence of noise or suchlike. As a result, display quality might be reduced. On the other hand, in the present embodiment, during the idle period T2, the CS driver 500 is driven in accordance with the first and second CS clock signals CCK1 and CCK2, as described above, so that the potentials of the control signals COUT(1) to COUT(m) are sequentially set to high level. Accordingly, the CS lines $CL_1$ to $CL_m$ are provided with the high potential Vh or the low potential Vl when their respective control signals COUT(1) to COUT(m) are set to a high-level potential. As a result, in the present embodiment, by the CS lines $CL_1$ to $CL_m$ being brought into floating state during the idle period T2, the influence of noise or suchlike on the CS lines $CL_1$ to $CL_m$ can be reduced. Thus, display quality can be inhibited from being reduced.

On the other hand, in the case where, to keep the CS lines $CL_1$ to $CL_m$ at the high potential Vh or the low potential Vl during the idle period T2, the first bias signals Vcs1 or the second bias signals Vcs2 are provided to the CS lines $CL_1$ to $CL_m$ through the bias thin-film transistors 60(1) to 60(m) being maintained in on-state, it is necessary to keep providing a high-level potential to the gate terminals of the bias thin-film transistors 60(1) to 60(m). Therefore, gate bias stress is placed on the bias thin-film transistors 60(1) to 60(m) for a long period of time, the bias thin-film transistors 60(1) to 60(m) experience significant threshold variations. As a result, the drive performance (reliability) of the bias thin-film transistors 60(1) to 60(m) is reduced. On the other hand, in the present embodiment, during the idle period T2, the CS driver 500 is driven in accordance with the first and second CS clock signals CCK1 and CCK2, as described above, so that the control signals COUT(1) to COUT(m) are sequentially set to a high-level potential. Therefore, the high-level potential is provided to each of the gate terminals of the bias thin-film transistors 60(1) to 60(m) only for one horizontal scanning period within the idle period T2. As a result, in the present embodiment, the gate bias stress on the bias thin-film transistors 60(1) to 60(m) is reduced, so that the threshold variations of the bias thin-film transistors 60(1) to 60(m) are reduced. Thus, the drive performance (reliability) of the bias thin-film transistors 60(1) to 60(m) can be inhibited from being reduced.

<1.10 Practical Example>

For the semiconductor layers of the thin-film transistors in the bistable circuits in the present embodiment, for example, a-Si, an oxide semiconductor, or the like, can be used. Note that as the oxide semiconductor, $InGaZnO_x$ (referred to below as "IGZO"), which is an oxide semiconductor mainly composed of indium, gallium, zinc, and oxygen, is typically used, but the present invention is not limited to this. For example, the oxide semiconductor may include at least one of the following: indium, gallium, zinc, copper, silicon, tin, aluminum, calcium, germanium, and lead.

Figure 18:
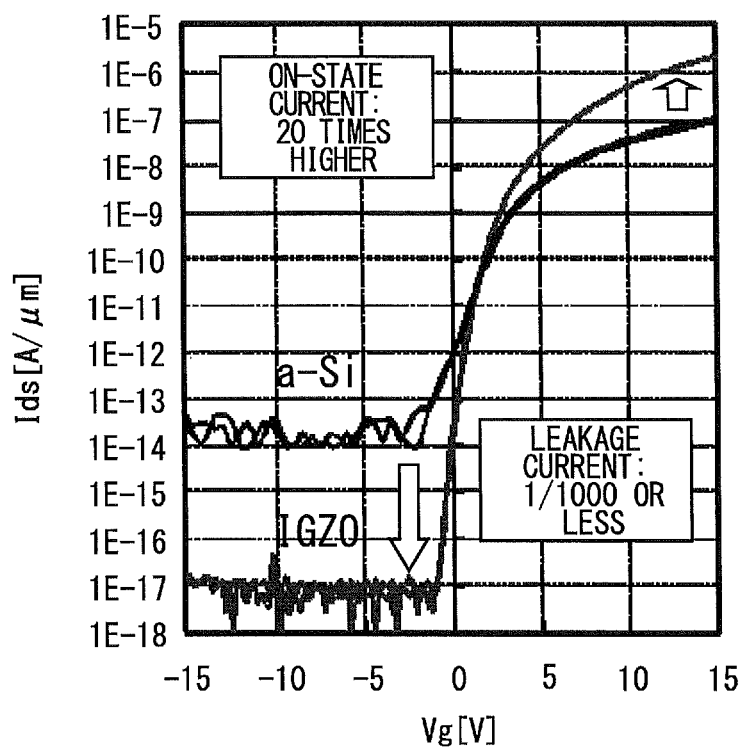
FIG. 18 is a graph showing drain current-gate voltage characteristics of an a-Si TFT and an IGZO TFT.

FIG. 18 is a graph showing drain current-gate voltage characteristics of an a-Si TFT and a TFT with an IGZO semiconductor layer (referred to below as an "IGZO TFT"). In FIG. 18, the horizontal axis represents the gate voltage Vg, and the vertical axis represents the drain current Ids. As shown in FIG. 18, the leakage current from the IGZO TFT is 1/1000 or less the leakage current from the a-Si TFT, and the on-state current of the IGZO TFT is about twenty times the on-state current of the a-Si TFT.

In the case where a-Si TFTs are used, the frame frequency can be reduced to, for example, about 45 Hz. On the other hand, in the case where IGZO TFTs are used as the thin-film transistors of the bistable circuits in the present embodiment, the frame frequency can be reduced to, for example, about 0.2 Hz, because the IGZO TFTs have low leakage current, as described above, and therefore, pixel TFTs have little leakage current, so that pixel potentials can be held for a longer period of time. Accordingly, in the case where the IGZO TFTs are used, the drive power of the CS driver 500 can be reduced to 1/100 or less compared to the case where the a-Si TFTs are used. More specifically, in the case where the IGZO TFTs are used, when the scanning-period CS frequency fcck1 is set at 60 Hz, the idle-period CS frequency fcck2 can be set at about 0.1 to 1 Hz.

Furthermore, the IGZO TFTs have large on-state current, as described above, and therefore, when the IGZO TFTs are used, TFT size can be reduced to about 1/20 compared to the case where the a-Si TFTs are used.

Note that in the case where the a-Si TFTs are used, the present embodiment can be realized at lower cost compared to the case where the IGZO TFTs are used.

<1.11 Effects>

In the present embodiment, one frame period includes the idle period T2 following the scanning period T1. Since the idle-period CS frequency fcck2 is lower than the scanning-period CS frequency fcck1, the total drive frequency for the CS driver 500 during one frame period is reduced. As a result, the power consumption required for driving the CS driver 500 is reduced. In addition, since the CS driver 500 is formed monolithically, the frame region of the liquid crystal display panel 800 is reduced in area, and the cost of the CS driver 500 is reduced.

Furthermore, in the present embodiment, the CS lines $CL_1$ to $CL_m$ are provided with the high potential Vh or the low potential Vl when their respective control signals COUT(1) to COUT(m) are set to a high-level potential during the idle period T2. As a result, the CS lines $CL_1$ to $CL_m$ are brought into floating state during the idle period T2, so that the influence of noise or suchlike on the CS lines $CL_1$ to $CL_m$ is reduced. Thus, display quality can be inhibited from being reduced. Moreover, the high-level potential is provided to each of the gate terminals of the bias thin-film transistors 60(1) to 60(m) for one horizontal scanning period during the idle period T2, so that the gate bias stress on the bias thin-film transistors 60(1) to 60(m) is reduced. As a result, threshold variations of the bias thin-film transistors 60(1) to 60(m) are reduced, so that the drive performance (reliability) of the bias thin-film transistors 60(1) to 60(m) can be inhibited from being reduced.

Furthermore, in the present embodiment, the idle period T2 is set longer than the scanning period T1, and therefore, even lower power consumption can be achieved.

In the case where IGZO TFTs are used as the thin-film transistors of the CS bistable circuits in the present embodiment, the idle-period CS frequency fcck2 can be further reduced, because leakage current from the IGZO TFTs is sufficiently small. Thus, power consumption can be reduced. Moreover, in this case, TFT size can be rendered sufficiently small, because the on-state current of the IGZO TFTs is sufficiently high. Thus, the frame region can be rendered even narrower.

On the other hand, in the case where a-Si TFTs are used as the thin-film transistors of the CS bistable circuits in the present embodiment, further cost reduction can be achieved.

Note that in the present embodiment, since one frame period includes the idle period T2 following the scanning period T1, the total drive frequency for the gate driver 400 during one frame period is reduced, so that the power consumption required for driving the gate driver 400 can also be reduced. In addition, during the idle period T2, the frequency of the gate clock signals GCK is lower than during the scanning period T1, so that the power consumption required for driving the gate driver 400 can be reduced in this respect as well.

<2. Second Embodiment>
<2.1 Operation During the Idle Period>

Figure 19:
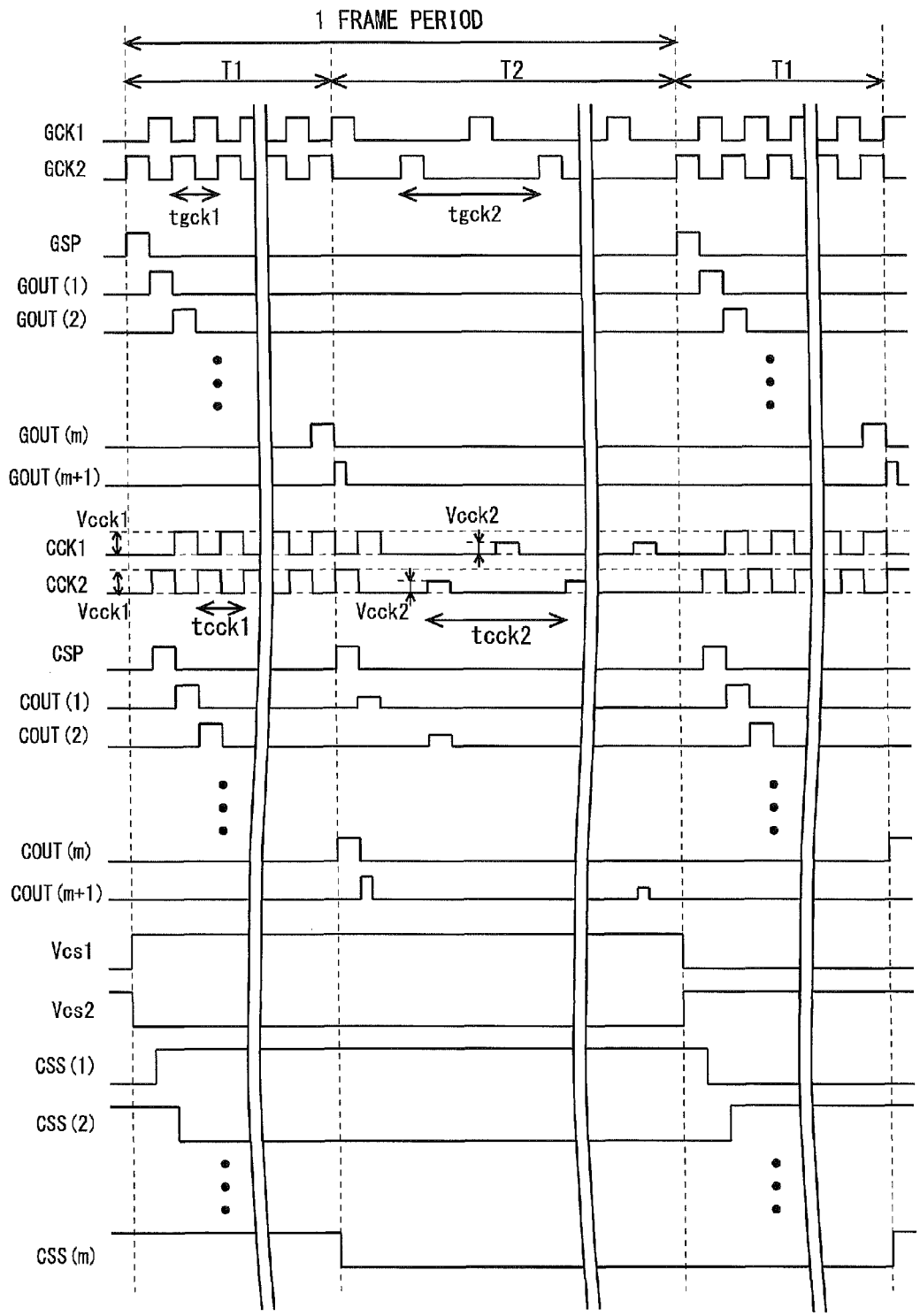
FIG. 19 is a signal waveform diagram describing the operation of a CS driver in a second embodiment of the present invention during the idle period.

FIG. 19 is a signal waveform diagram describing the operation of the CS driver 500 in a second embodiment of the present invention, particularly focusing on the operation during the idle period T2. Note that the present embodiment is the same as the first embodiment except for operations during the idle period, and therefore, any descriptions of common points therebetween will be omitted. In the present embodiment, the idle-period CS amplitude Vcck2 is smaller than the scanning-period CS amplitude Vcck1, as shown in FIG. 19. Note that to reliably bring the bias thin-film transistors 60(1) to 60(m) into on-state during the idle period T2, the idle-period CS amplitude Vcck2 is required to be greater than the threshold voltage for the bias thin-film transistors 60(1) to 60(m). That is, in the present embodiment, the idle-period CS amplitude Vcck2 is smaller than the scanning-period CS amplitude Vcck1 but greater than the threshold voltage for the bias thin-film transistors 60(1) to 60(m).

<2.2 Effects>

In the present embodiment, the idle-period CS amplitude Vcck2, which is the amplitude of each of the first and second CS clock signals CCK1 and CCK2 during the idle period T2, is smaller than the scanning-period CS amplitude Vcck1, which is the amplitude of each of the first and second CS clock signals CCK1 and CCK2 during the scanning period T1. Thus, even lower power consumption can be achieved. Moreover, the gate bias stress on the bias thin-film transistors 60(1) to 60(m) during the idle period V2 is reduced, so that the reliability of the bias thin-film transistors 60(1) to 60(m) can be further enhanced.

<3. Third Embodiment>
<3.1 Overall Configuration and Operation>

Figure 20:
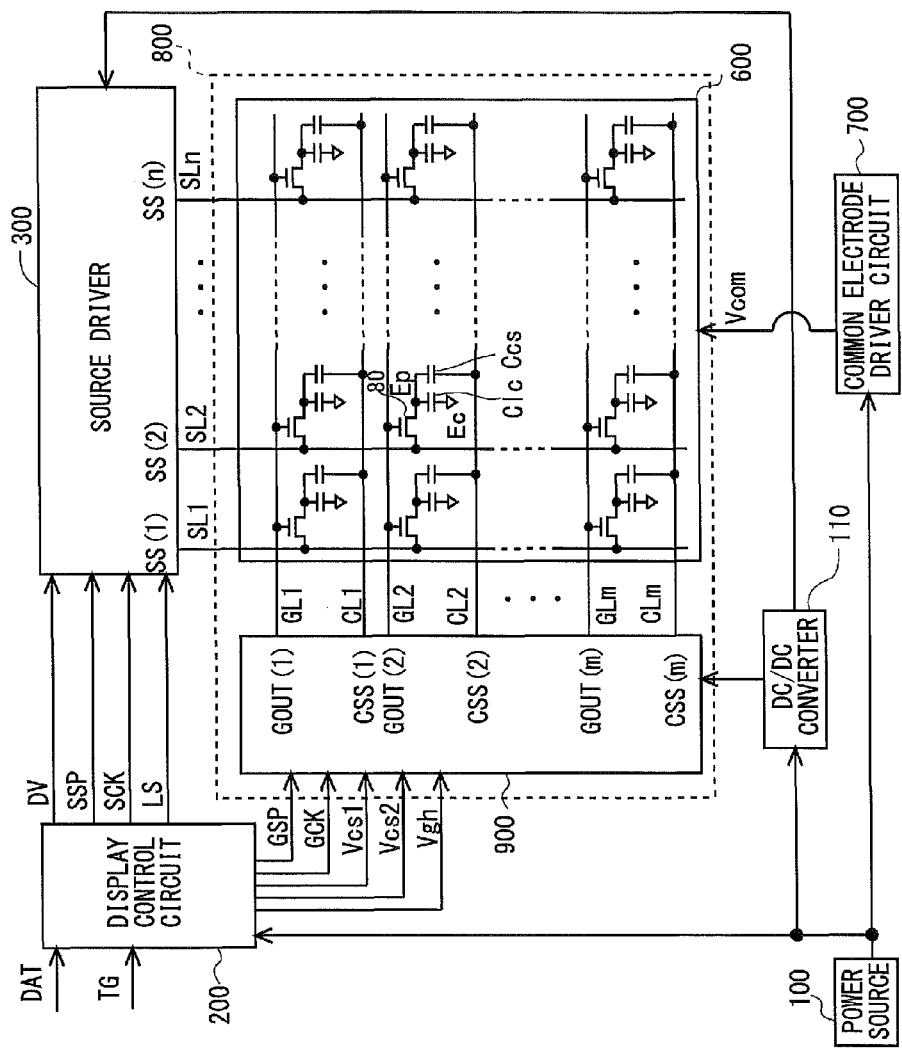
FIG. 20 is a block diagram illustrating the overall configuration of a liquid crystal display device according to a third embodiment of the present invention.

FIG. 20 is a block diagram illustrating the overall configuration of an active-matrix liquid crystal display device according to a third embodiment of the present invention. In the present embodiment, the same elements as in the first embodiment are denoted by the same reference characters, and any descriptions thereof will be omitted. The liquid crystal display device according to the present embodiment includes a gate/CS driver 900 in place of the gate driver 400 and the CS driver 500 of the first embodiment, as shown in FIG. 20. The gate/CS driver 900 consists of the gate driver 400 and the CS driver 500, as will be described later. The gate/CS driver 900 is formed integrally with the display portion 600 on the liquid crystal display panel 800. That is, in the present embodiment, the gate driver 400, not only the CS driver 500, is formed integrally with the display portion 600. As with the CS driver 500, the gate driver 400 is formed of, for example, amorphous silicon, polycrystalline silicon, microcrystalline silicon, or an oxide semiconductor (e.g., IGZO) on the liquid crystal display panel 800 including the display portion 600.

Unlike in the first embodiment, the display control circuit 200 outputs neither the CS clock signal CCK nor the CS start pulse signal CSP. That is, in the present embodiment, the display control circuit 200 outputs only the digital video signal DV, the source start pulse signal SSP, the source clock signal SCK, the latch strobe signal LS, the gate start pulse signal GSP, the gate end pulse signal GEP, the gate clock signal GCK, the first bias signal Vcs1, and the second bias signal Vcs2. In the present embodiment, the gate start pulse signal GSP, the gate clock signal GCK, and the clock signal are realized. Moreover, the gate start pulse signal GSP and the gate clock signal GCK realize auxiliary capacitance clock signals.

In accordance with the gate start pulse signal GSP and the gate clock signal GCK outputted by the display control circuit 200, the gate driver 400 in the gate/CS driver 900 repeats application of scanning signals GOUT(1) to GOUT(m) at a high-level potential to the gate lines $GL_1$ to $GL_m$, respectively, in cycles of one frame period. In accordance with the gate clock signals GCK (first and second gate clock signals GCK1 and GCK2), the first bias signal Vcs1, and the second bias signal Vcs2 outputted by the display control circuit 200, the CS driver 500 in the gate/CS driver 900 applies auxiliary capacitance signals CSS(1) to CSS (m) to the CS lines $CL_1$ to $CL_m$, respectively, to bias the pixel potentials Vd. In the present embodiment, the first and second gate clock signals GCK1 and GCK2 realize first shift operation clock signals.

<3.2 Configuration of the Gate CS Driver>

Figure 21:
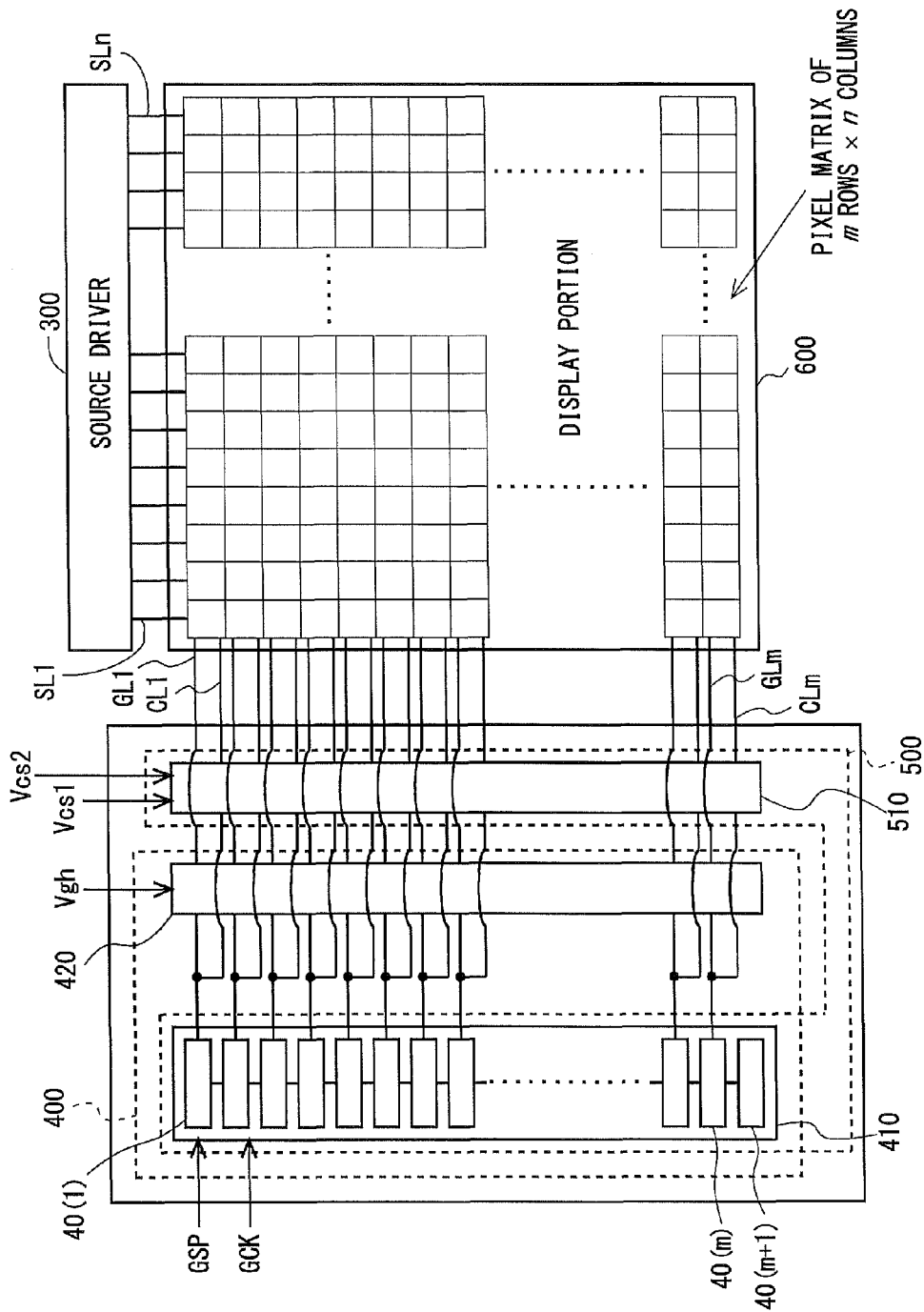
FIG. 21 is a block diagram describing the configuration of a gate/CS driver in the third embodiment.

FIG. 21 is a block diagram describing the configuration of the gate/CS driver 900 in the present embodiment. The gate/CS driver 900 consists of the gate driver 400 and the CS driver 500, as described above. The gate driver 400 consists of the gate shift register 410 (hereinafter in the present embodiment, referred to simply as the "shift register") and an output buffer group 420, as shown in FIG. 21. The CS driver 500 consists of the shift register 410 and the CS output portion 520. That is, in the present embodiment, the gate driver 400 and the CS driver 500 share the shift register 410. In the present embodiment, the shift register 410 realizes a first shift register.

Figure 22:
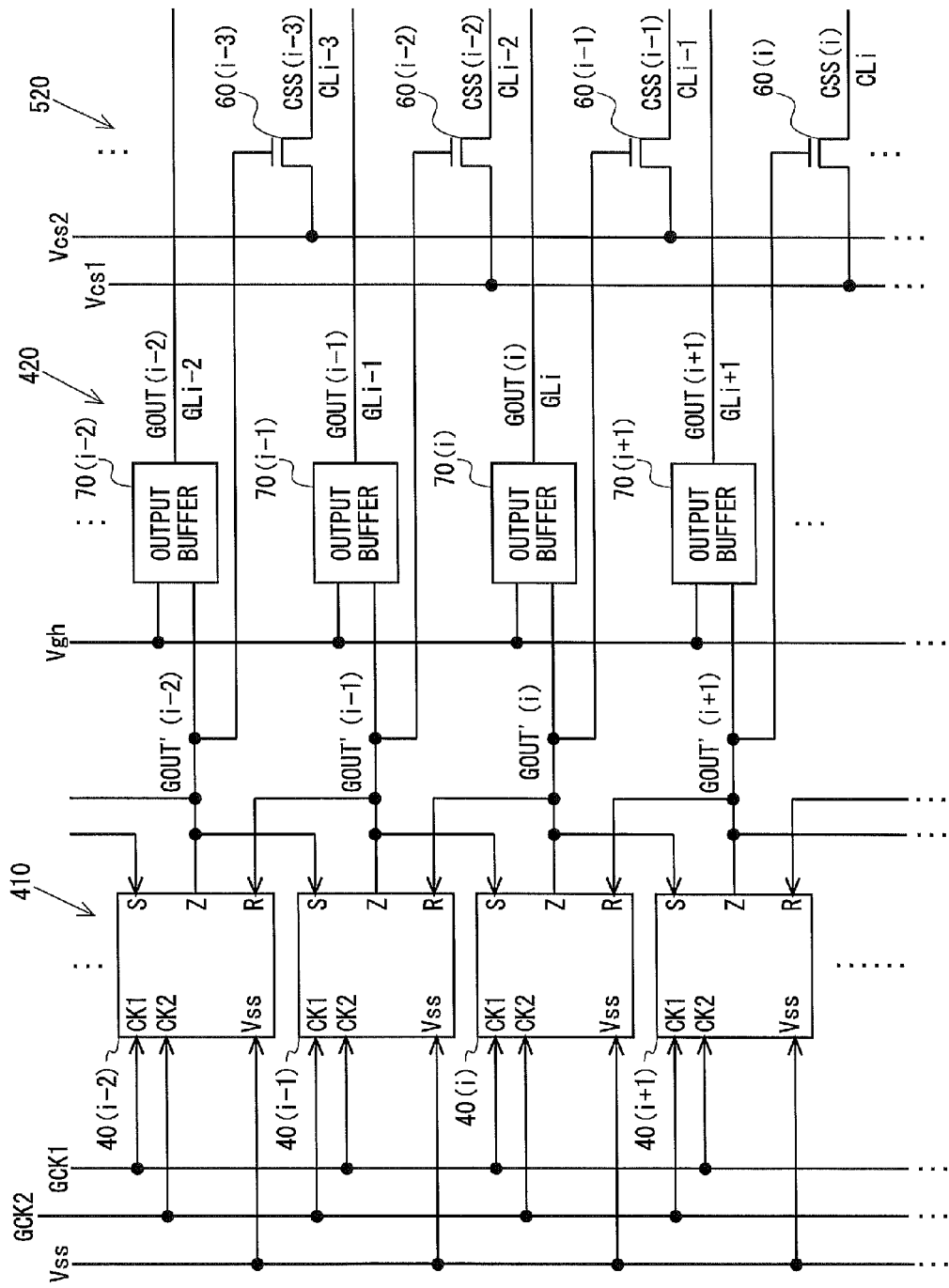
FIG. 22 is a block diagram illustrating the configuration of the gate/CS driver in the third embodiment.
Figure 23:
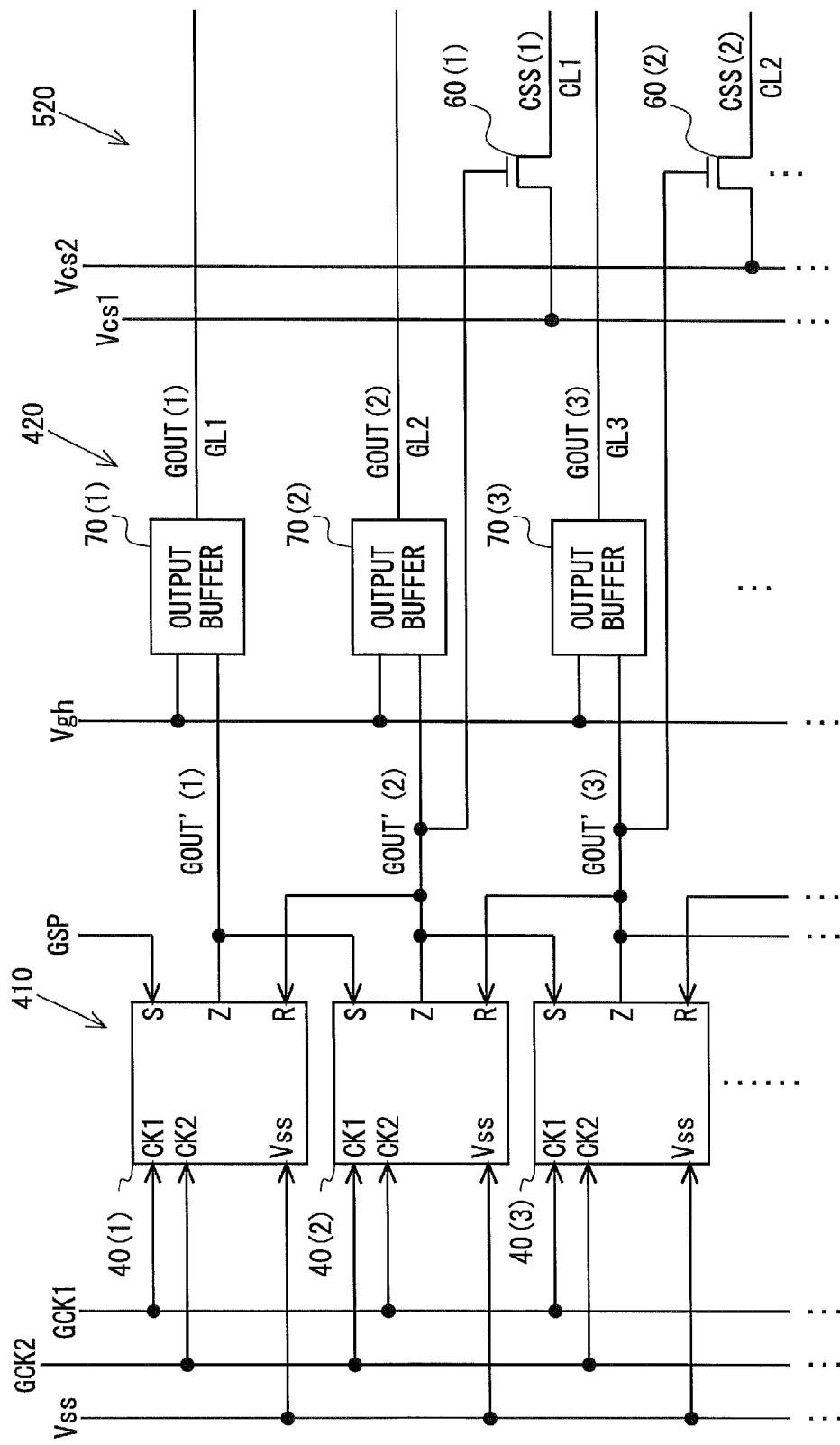
FIG. 23 is a block diagram illustrating the configuration of a portion of the gate/CS driver in the third embodiment, including the first-row stage.
Figure 24:
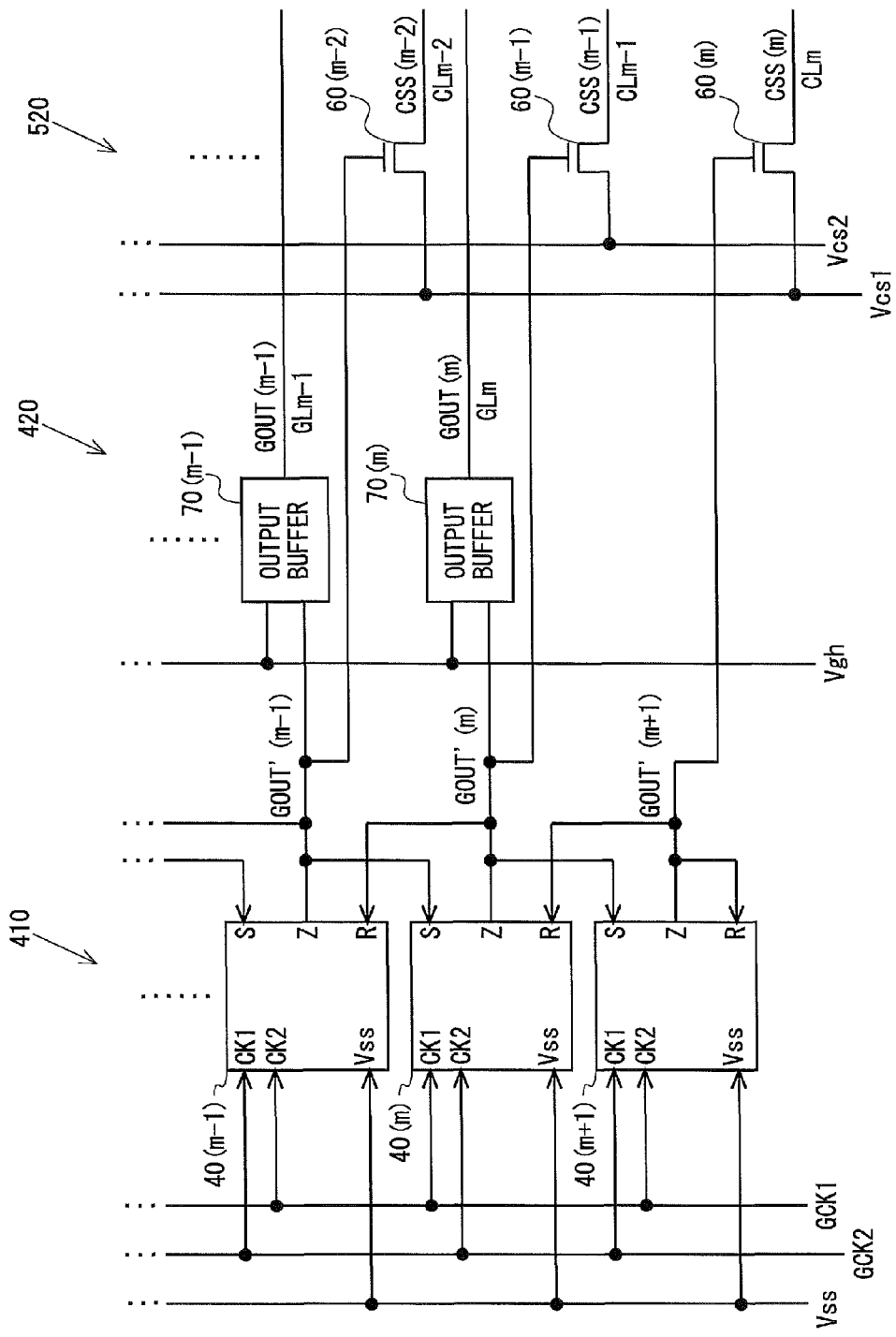
FIG. 24 is a block diagram illustrating the configuration of a portion of the gate/CS driver in the third embodiment, including the last-row stage.

FIG. 22 is a block diagram illustrating the configurations of the gate driver 400 and the CS driver 500 in the present embodiment, excluding the first-row stage and the last-row stage. FIG. 23 is a block diagram illustrating the configuration of a portion of the gate driver 400 and the CS driver 500 in the present embodiment, including the first-row stage. FIG. 24 is a block diagram illustrating the configuration of a portion of the gate driver 400 and the CS driver 500 in the present embodiment, including the last-row stage. Note that descriptions of common points with the first embodiment will be omitted for convenience's sake.

The shift register 410 consists of m gate bistable circuits (hereinafter in the present embodiment, referred to simply as "bistable circuits") 40(1) to 40(m), and a dummy bistable circuit 40(m+1) (hereinafter, also referred to simply as a "bistable circuit 40(m+1)"), as shown in FIGS. 22 to 24. The output buffer group 420 consists of m output buffers 70(1) to 70(m). The CS output portion 520 consists of the m bias thin-film transistors 60(1) to 60(m), as described above. In the present embodiment, the bistable circuits (gate bistable circuits) realize first bistable circuits.

In the present embodiment, the bias thin-film transistors 60(1) to 60(m) correspond to the bistable circuits 40(1) to 40(m), but they are staggered from each other by one stage compared to the first embodiment. Specifically, in the present embodiment, the bias thin-film transistors 60(1) to 60(m) correspond to the bistable circuits 40(2) to 40(m+1), respectively. Note that the bias thin-film transistors 60(1) to 60(m) correspond to the CS lines $CL_1$ to $CL_m$, respectively, as in the first embodiment. Each bias thin-film transistor is connected at a gate terminal to an output terminal 49 (a terminal from which a state signal Z is outputted) of its corresponding bistable circuit, and at a drain terminal to its corresponding CS line. Each odd-stage bias thin-film transistor is provided with a first bias signal Vcs1 at a source terminal, and each even-stage bias thin-film transistor is provided with a second bias signal Vcs2 at a source terminal.

Figure 25:
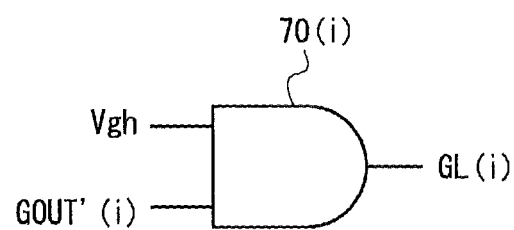
FIG. 25 is a circuit diagram illustrating a configuration example of an output buffer in the third embodiment.

The output buffers 70(1) to 70(m) correspond to the bistable circuits 40(1) to 40(m), respectively, and also correspond to the gate lines $GL_1$ to $GL_m$, respectively. Each output buffer is realized, for example, by an AND circuit shown in FIG. 25. Here, the AND circuit shown realizes the output buffer 70(i). In some cases below, an output buffer and an AND circuit that realizes the output buffer are represented by the same numeral. Each AND circuit is connected at one input terminal to an output terminal 49 of its corresponding bistable circuit (i.e., a control signal is provided to the input terminal), provided with its corresponding bias input signal Vgh at the other input terminal, and connected at an output terminal to its corresponding gate line. The bias input signal Vgh is provided to the AND circuit by the display control circuit 200. In addition, the bias input signal Vgh is set at a high-level potential (Vdd potential) during the scanning period T1, and also set at a low-level potential (Vss potential) during the idle period T2.

<3.3 Operation of the Gate/CS Driver>

Figure 26:
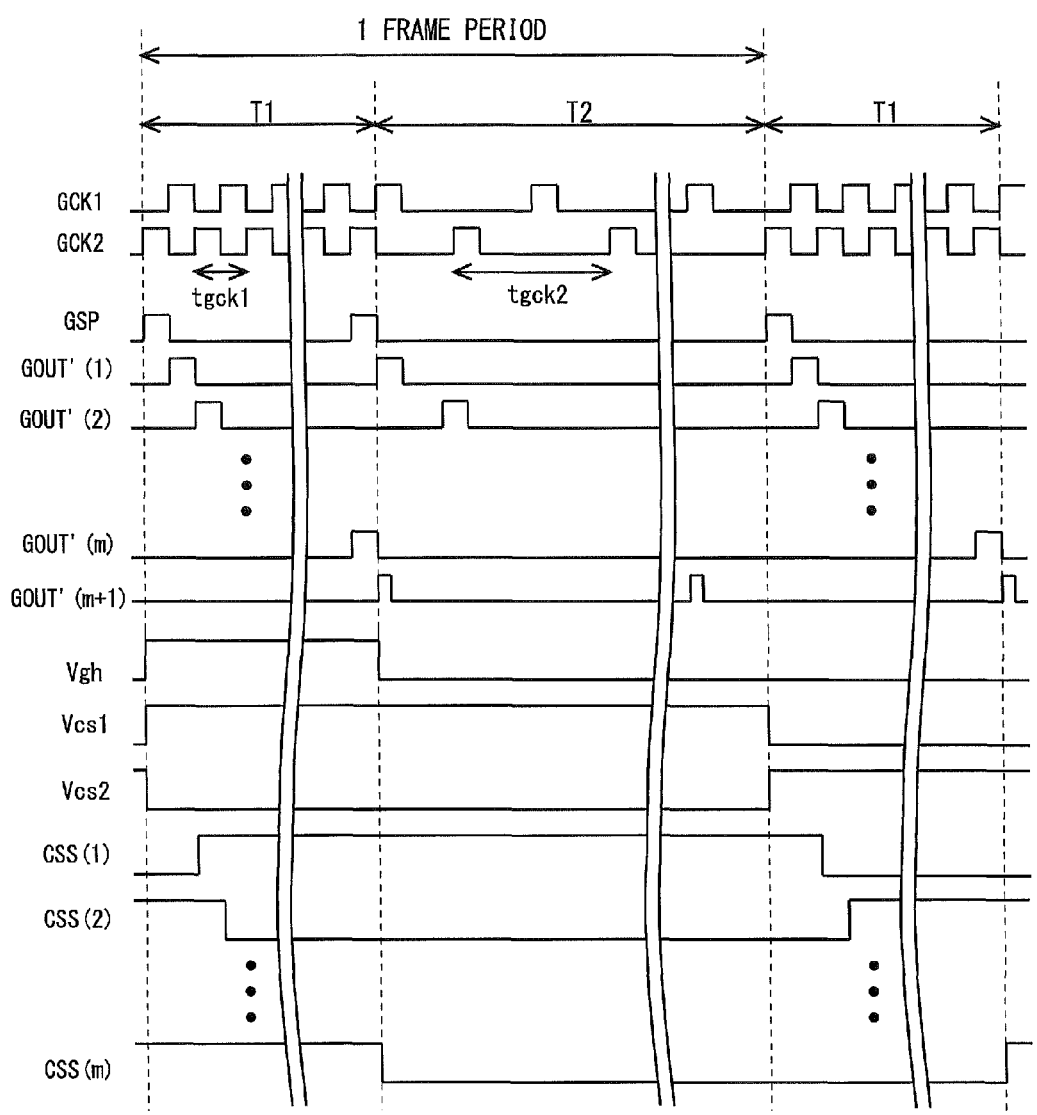
FIG. 26 is a signal waveform diagram describing the operation of the gate/CS driver in the third embodiment.

FIG. 26 is a signal waveform diagram describing the operation of the gate/CS driver 900 in the present embodiment. First, the operation during the scanning period T1 will be described. During the scanning period T1, the gate/CS driver 900 is driven at a scanning-period gate frequency fgck1. After the gate start pulse signal GSP is set to a high-level potential, control signals GOUT'(1) to GOUT'(m) are sequentially set to a high-level potential in accordance with the first and second gate clock signals GCK1 and GCK2, as shown in FIG. 26. During the scanning period T1, the bias input signal Vgh is at a high-level potential, and therefore, the potentials of output signals from the AND circuits 70(1) to 70(m) are set to high level correspondingly as the control signals GOUT'(1) to GOUT'(m) are set to a high-level potential. That is, the scanning signals GOUT(1) to GOUT(m) are set to a high-level potential correspondingly as the control signals GOUT'(1) to GOUT'(m) are set to a high-level potential.

Here, it is assumed that during the scanning period T1, the potential of the first bias signal Vcs1 is a high potential Vh, and the potential of the second bias signal Vcs2 is a low potential Vl. When the control signal GOUT'(2), which is an output signal from the second-stage bistable circuit 40(2), is set to a high-level potential, its corresponding bias thin-film transistor 60(1) is brought into on-state. Since the bias thin-film transistor 60(1) has the first bias signal Vcs1 provided at the source terminal, the potential of the auxiliary capacitance signal CSS(1) applied to the CS line (1) changes to the high potential Vh. The potential of the auxiliary capacitance signal CSS(1) is maintained until the bias thin-film transistor 60(1) is brought into on-state during the following frame period.

When the control signal GOUT'(3), which is an output signal from the third-stage bistable circuit 40(3), is set to a high-level potential, its corresponding bias thin-film transistor 60(2) is brought into on-state. Since the bias thin-film transistor 60(2) has the second bias signal Vcs2 provided at the source terminal, the potential of the auxiliary capacitance signal CSS(2) applied to the CS line (2) changes to the low potential Vl. The potential of the auxiliary capacitance signal CSS(2) is maintained until the bias thin-film transistor 60(2) is brought into on-state during the following frame period. Thereafter, the potential of each of the auxiliary capacitance signals applied to the CS lines changes sequentially as well in accordance with control signals, which are output signals from the bistable circuits.

Note that to set the auxiliary capacitance signals CSS(1) to CSS(m) sequentially to a high-level potential during the idle period T2, the gate start pulse signal GSP is set to a high-level potential again during the last horizontal scanning period within the scanning period T1, as shown in FIG. 26.

Next, the operation during the idle period T2 will be described. During the idle period T2, the gate/CS driver 900 is driven at an idle-period gate frequency fgck2 lower than the scanning-period gate frequency fgck1. Since the gate start pulse signal GSP is set at a high-level potential during the last horizontal scanning period within the scanning period T1, as described above, the control signals GOUT'(1) to GOUT'(m) are sequentially set to a high-level potential in accordance with the first and second gate clock signals GCK1 and GCK2, which are at the idle-period CS frequency fcck2 lower than the scanning-period CS frequency fcck1. However, during the idle period T2, the bias input signal Vgh is at a low-level potential, and therefore, the potential of each of the output signals from the AND circuits 70(1) to 70(m) is maintained at low level. That is, during the idle period T2, the scanning signals GOUT(1) to GOUT(m) are maintained at a low-level potential.

Furthermore, during the idle period T2, once the control signals GOUT'(1) to GOUT'(m) are sequentially set to a high-level potential, the bias thin-film transistors 60(1) to (m) are brought into on-state correspondingly. During the idle period T2, each of the first and second bias signals Vcs1 and Vcs2 is at the same potential as during the scanning period T1. Accordingly, there is no change in the potentials of the auxiliary capacitance signals CSS(1) to CSS(m) respectively provided to the CS lines $CL_1$ to $CL_m$.

Note that in the present embodiment, the configuration and the operation of the bistable circuits are the same as the configuration and the operation of the gate bistable circuits or the CS bistable circuits in the first embodiment, and therefore, any descriptions thereof will be omitted.

<3.4 Effects>

In the present embodiment, the shift register 410 can be shared between the gate driver 400 and the CS driver 500. As a result, circuit scale can be reduced, leading to, for example, an even narrower frame region. In addition, the gate driver 400, not only the CS driver 500, is formed monolithically, resulting in reduced cost of the gate driver 400 and a further narrowing of the frame region.

Note that in the case where the amplitude of each of the first and second gate clock signals GCK1 and GCK2 during the idle period T2 (referred to below as the "idle-period gate amplitude") is set lower than the amplitude of each of the first and second gate clock signals GCK1 and GCK2 during the scanning period T1 (referred to below as the "scanning-period gate amplitude"), even lower power consumption can be achieved. However, in such a case, the idle-period gate amplitude is less than the scanning-period gate amplitude but greater than both the threshold voltage for the bias thin-film transistors 60(1) to 60(m) and the threshold voltage for the thin-film transistors that realize the output buffers 70(1) to 70(m).

Note that the output buffers are not limited to the AND circuits so long as each of them can substantially output the logical AND of a buffer input signal Vgh provided and a control signal, which is an output signal from its corresponding bistable circuit.

<4. Fourth Embodiment>

Figure 27:
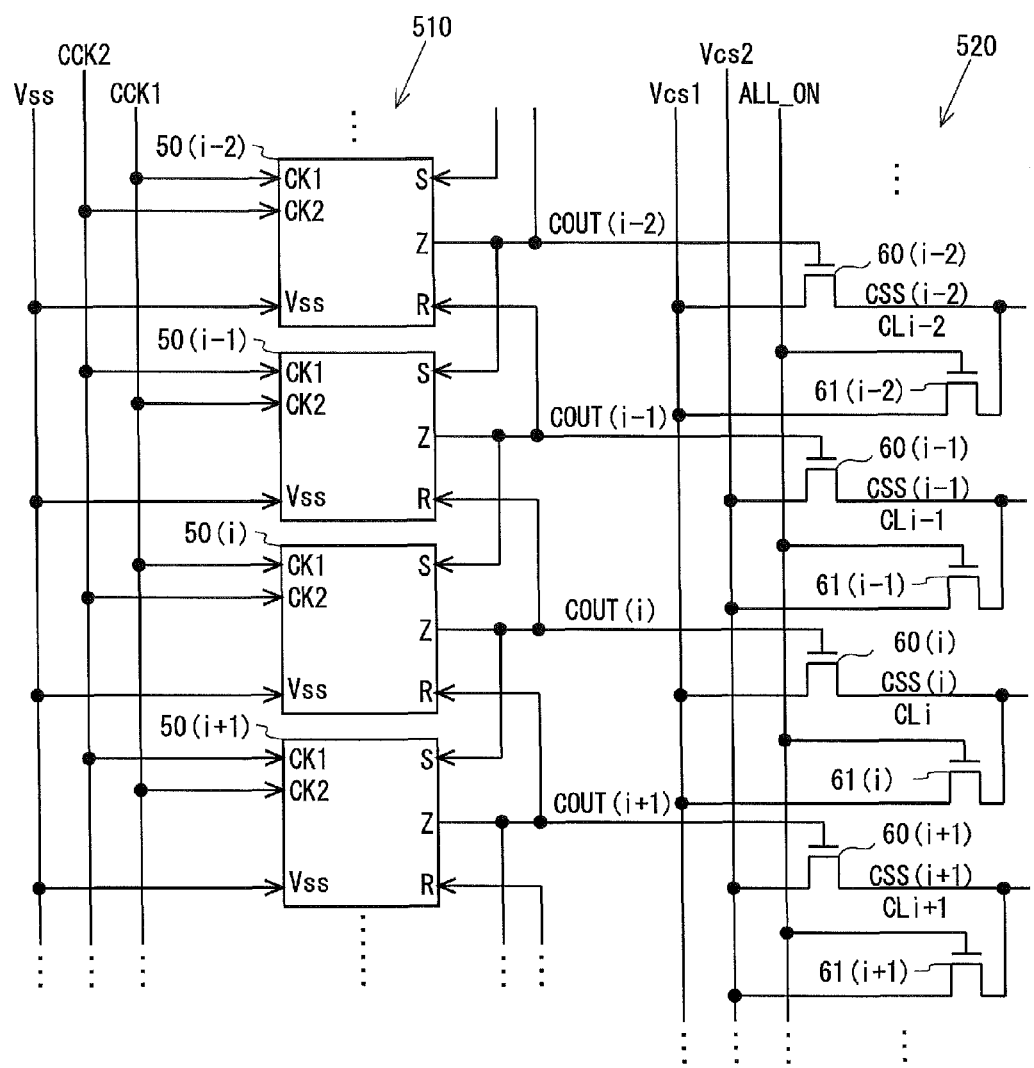
FIG. 27 is a block diagram illustrating the configuration of a CS driver in a fourth embodiment of the present invention.

<4.1 Configuration of the CS Driver>FIG. 27 is a block diagram illustrating the configuration of the CS driver 500 in a fourth embodiment of the present invention. Note that the present embodiment is the same as the first embodiment except for the structure of the CS driver 500 and the operation during the idle period, and therefore, any descriptions of common points therebetween will be omitted. In the present embodiment, the CS driver 500 further includes m idle-operation thin-film transistors (second switching elements) 61(1) to 61(m) provided corresponding to the m gate lines GL1 to GLm, respectively, as shown in FIG. 27. Moreover, the idle-operation thin-film transistors 61(1) to 61(m) correspond to the CS bistable circuits 50(1) to 50(m), respectively.

Each idle-operation thin-film transistor is provided with an idle-period operation clock signal ALL_ON at a gate terminal, and is connected at a drain terminal to its corresponding gate line. The idle-period operation clock signal ALL_ON is provided by the display control circuit 200. Moreover, the idle-period operation clock signal ALL_ON is set constantly at a low-level potential during the scanning period T1. Note that in the following, the cycle of the idle-period operation clock signal ALL_ON during the idle period T2 (referred to below as the "idle-period ALL_ON cycle") will be denoted by the symbol tack2. In addition, the frequency of the idle-period operation clock signal ALL_ON during the idle period T2 (referred to below as the "idle-period ALL_ON frequency") will be denoted by the symbol fack2.

The idle-period operation clock signal ALL_ON is set to a high-level potential every idle-period ALL_ON cycle tack2. The idle-period ALL_ON cycle tack2 is longer than the scanning-period CS cycle tcck1. That is, the idle-period ALL_ON frequency fack2 is lower than the scanning-period CS frequency fcck1.

Each idle-operation thin-film transistor corresponding to an odd-stage CS bistable circuit is provided with a first bias signal Vcs1 at a drain terminal. On the other hand, each idle-operation thin-film transistor corresponding to an even-stage CS bistable circuit is provided with a second bias signal Vcs2 at a drain terminal. In the present embodiment, the idle-period operation clock signal ALL_ON, the CS clock signal CCK, and the CS start pulse signal CSP realize auxiliary capacitance clock signals.

<4.2 Operation of the CS Driver>

Figure 28:
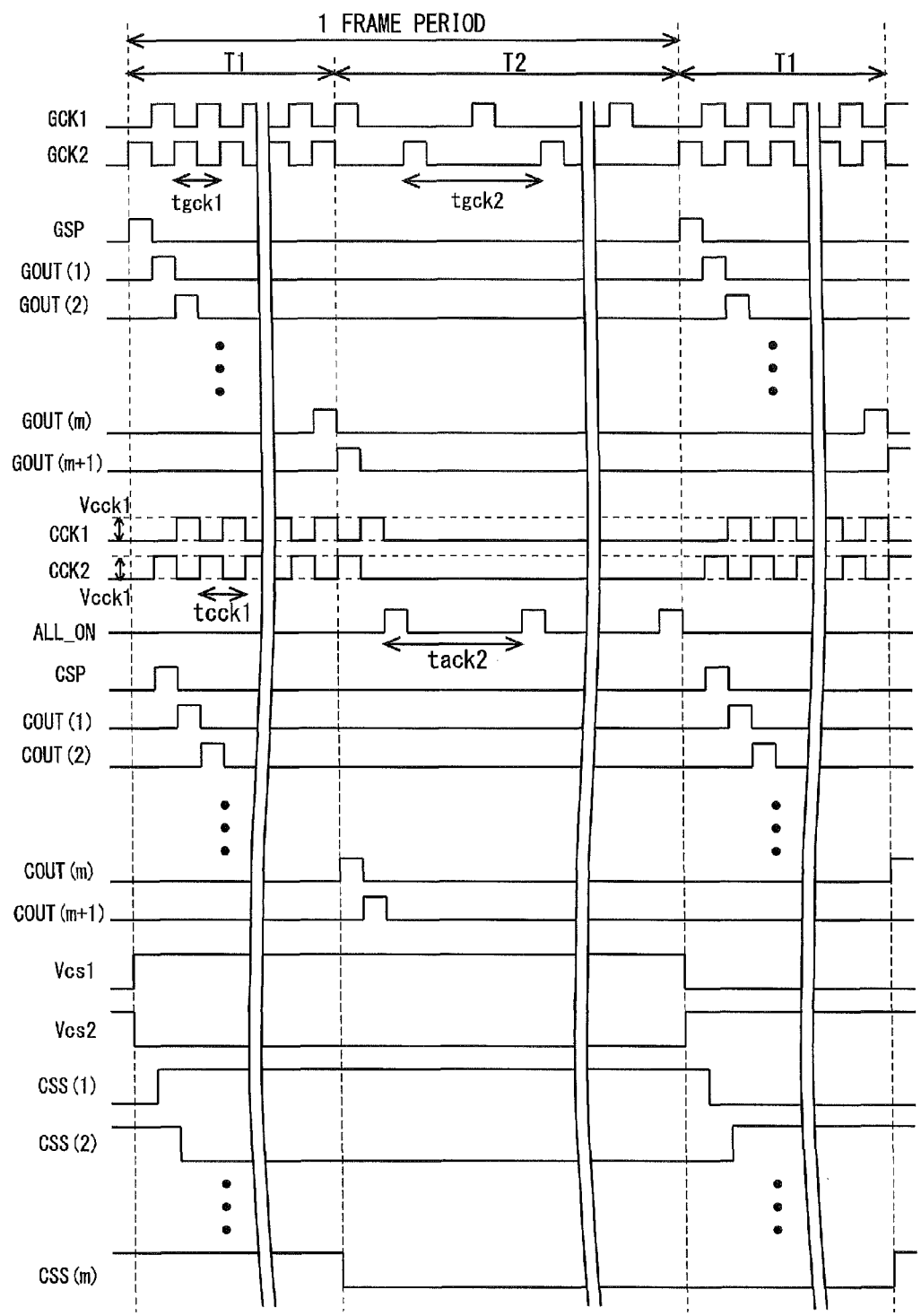
FIG. 28 is a signal waveform diagram describing the operation of the CS driver in the fourth embodiment.

FIG. 28 is a signal waveform diagram describing the operation of the CS driver 500 in the present embodiment, focusing especially on the operation during the idle period T2. The idle-period operation clock signal ALL_ON is maintained at a low-level potential during the scanning period T1, as described above.

In the present embodiment, unlike in the first embodiment, each of the first and second CS clock signals CCK1 and CCK2 is maintained at a low-level potential during the idle period T2. In this case, the idle-period CS frequency fcck2 is 0. In addition, the CS start pulse signal CSP is not set to a high-level potential during the idle period T2. Accordingly, each of the control signals COUT(1) to COUT(m) is not set to a high-level potential during the idle period T2. In addition, the idle-period operation clock signal ALL_ON is set to a high-level potential every idle period ALL_ON cycle tack2 during the idle period T2. When the idle-period operation clock signal ALL_ON is set to a high-level potential, the idle-operation thin-film transistors 61(1) to 61(m) are brought into on-state. The potential of each of the first and second bias signals Vcs1 and Vcs2 during the idle period T2 is the same as during the scanning period T1. Therefore, there is no change in the potentials of the auxiliary capacitance signals CSS(1) to CSS (m) respectively provided to the CS lines $CL_1$ to $CL_m$.

Note that the operation of the CS driver 500 other than the above is the same as in the first embodiment, and therefore, any description thereof will be omitted.

<4.3 Effects>

In the present embodiment, the CS lines $CL_1$ to $CL_m$ are provided with the high potential Vh or the low potential Vl when the idle-period operation clock signal ALL_ON is set to a high-level potential during the idle period T2, rather than when their respective control signals COUT(1) to COUT(m) are set to a high-level potential. Accordingly, the CS lines $CL_1$ to $CL_m$ are brought into floating state during the idle period T2, so that the influence of noise or suchlike on the CS lines $CL_1$ to $CL_m$ is reduced. As a result, display quality can be inhibited from being reduced. Moreover, each of the first and second CS clock signals CCK1 and CCK2 is maintained at a low-level potential during the idle period T2, so that even lower power consumption can be achieved. In addition, since each of the control signals COUT(1) to COUT(m) is not set to a high-level potential during the idle period T2, the gate bias stress on the bias thin-film transistors 60(1) to 60(m) is further reduced. Accordingly, threshold variations of the bias thin-film transistors 60(1) to 60(m) are further reduced, so that the reliability of the bias thin-film transistors 60(1) to 60(m) can be further enhanced. Note that even in the case where there are threshold variations of the idle-operation thin-film transistors 61(1) to 61(m), display is less affected compared to the case where there are threshold variations of the bias thin-film transistors 60(1) to 60(m).

<5. Fifth Embodiment>

Figure 29:
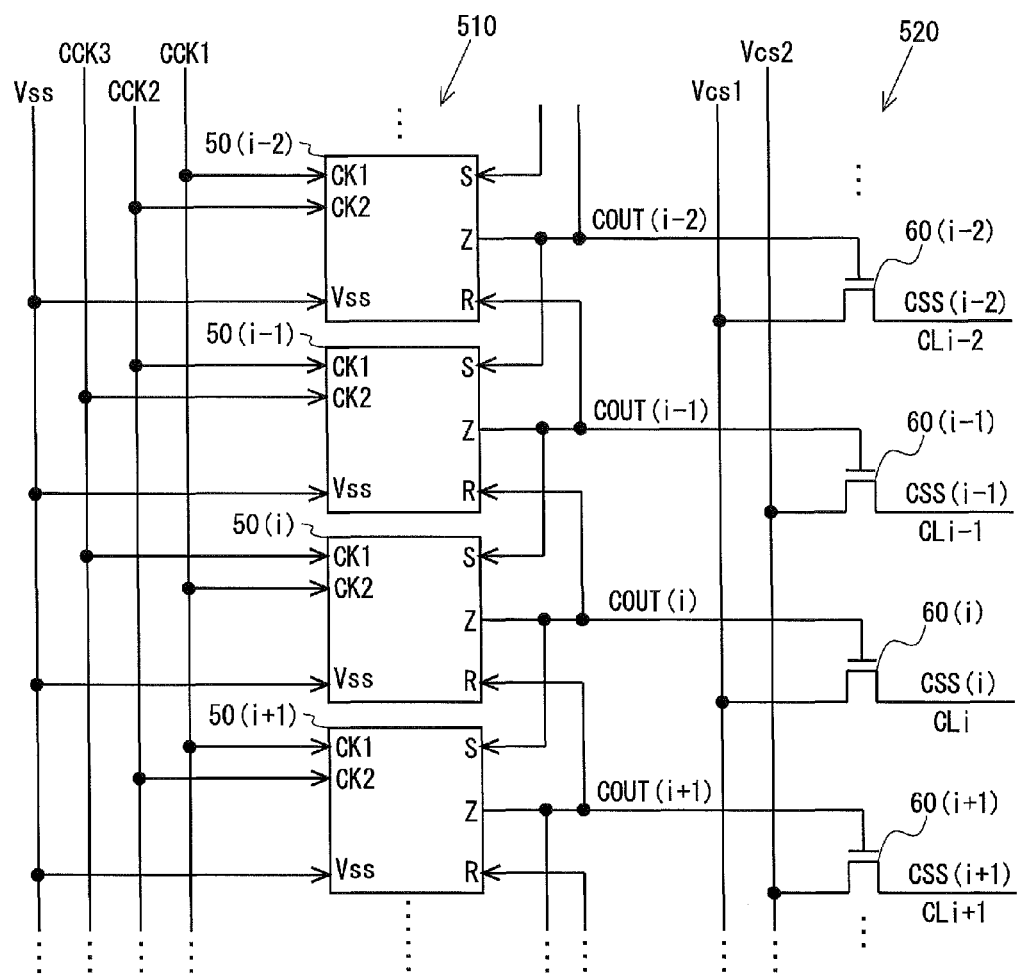
FIG. 29 is a block diagram illustrating the configuration of a CS driver in a fifth embodiment of the present invention.

<5.1 Configuration and Operation of the CS Shift Register>FIG. 29 is a block diagram describing the configuration of the CS shift register 510 in a fifth embodiment of the present invention. Note that the present embodiment is the same as the first embodiment except for the configuration and the operation of the CS shift register 510, and therefore, any descriptions of common points therebetween will be omitted. In the present embodiment, the CS clock signal CCK provided to the CS driver 500 by the display control circuit 200 consists of three phases, i.e., CS clock signals CCK1 to CCK3. In the following, the CS clock signal CCK3 will be referred to as the "third CS clock signal". The first CS clock signal CCK1, the second CS clock signal CCK2, and the third CS clock signal CCK3 are out of phase from one another by one horizontal scanning period, and each of them is set at a high-level potential (Vdd potential) for one of the three horizontal scanning periods (except for during the idle period T2).

The following signals are provided to the input terminals of the stages (CS bistable circuits) in the CS shift register 510. The first CS clock signal CCK1 is provided to the (i−2)'th stage as a first clock signal CK1, and the second CS clock signal CCK2 as a second clock signal CK2. The second CS clock signal CCK2 is provided to the (i−1)'th stage as a first clock signal CK1, and the third CS clock signal CCK3 as a second clock signal CK2. The third CS clock signal CCK3 is provided to the i'th stage as a first clock signal CK1, and the first CS clock signal CCK1 as a second clock signal CK2. Note that the signals provided to the terminals intended for receiving set signals S and reset signals R are the same as in the first embodiment, and therefore, any descriptions thereof will be omitted.

Figure 30:
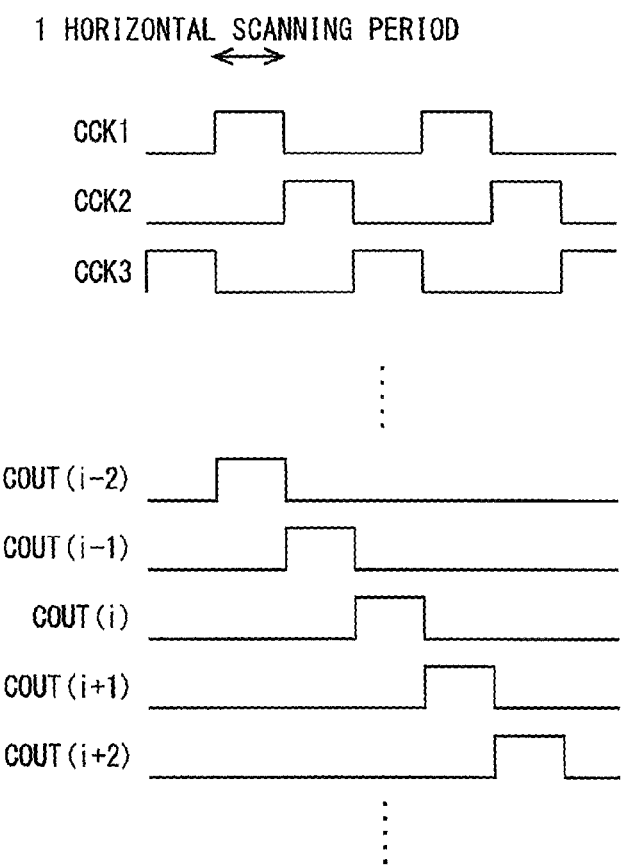
FIG. 30 is a signal waveform diagram describing the operation of a CS shift register in the fifth embodiment.

In the configuration as above, when a CS start pulse signal CSP is provided to the first stage 50(1) of the CS shift register 510 as a set signal S, control signals that are to be sequentially set at a high-level potential for one horizontal scanning period each are provided to the CS output portion 520 within the CS driver 500 in accordance with the first CS clock signal CCK1, the second CS clock signal CCK2, and the third CS clock signal CCK3, as shown in FIG. 30.

<5.2 Power Consumption>

In general, power consumption W required for driving the CS driver (hereinafter, simply referred to as "power consumption W") can be obtained by equation (1) below.

$$W=n \times f \times (Cp+Ct) \times V^2 \qquad (1),$$

where n represents the number of phases of the CS clock signal CCK, f represents the frequency of the CS clock signal GCK, Cp represents wiring capacitance, and Ct represents load capacitance of the thin-film transistors.

In the first embodiment, the number of phases of the CS clock signal CCK is two. Accordingly, based on equation (1), power consumption W for the first embodiment can be expressed by equation (2) below.

$$W=2 \times f \times (Cp+Ct) \times V^2 \qquad (2)$$

On the other hand, in the present embodiment, the number of phases of the CS clock signal CCK is three. Moreover, looking at each phase of the CS clock signal CCK (hereinafter, simply referred to as "each phase"), the number of input terminals 41 or 42 of the bistable circuits to which each phase is provided in the present embodiment (referred to below as "the number of connections") is less than the number of connections in the first embodiment. This means a reduction in the load capacitance of the thin-film transistors for each phase. In the first embodiment, each phase is provided alternatingly to either the input terminal 41 or 42 of each stage, and therefore, the number of connections is m. Note that for convenience's sake, the dummy stage 50(m+1) is not taken into consideration here. On the other hand, in the present embodiment, each phase is provided alternatingly to either the input terminal 41 or 42 of every other stage, so that each stage receives two of the phases at the input terminals 41 and 42, and therefore, the number of connections is (⅔)×m. That is, the load capacitance of the thin-film transistors for each phase in the present embodiment is ⅔ of that for the first embodiment. Accordingly, based on equation (1), power consumption W for the present embodiment can be expressed by equation (3) below.

$$W=3 \times f \times (Cp+(\tfrac{2}{3}) \times Ct) \times V^2 \qquad (3)$$

Here, assuming that Cp=Ct/3, equations (2) and (3) can be expressed by equations (4) and (5), respectively, as below.

$$W=2.67 \times f \times Ct \times V^2 \qquad (4)$$

$$W=2 \times f \times Ct \times V^2 \qquad (5)$$

From equations (4) and (5), power consumption W for the present embodiment can be reduced by about 30% compared to that for the first embodiment.

<5.3 Effects>

In the present embodiment, the number of phases of the CS clock signal CCK is three. Accordingly, the number of input terminals 41 or 42 of the CS bistable circuits to which each phase is provided (the number of connections) is less than the number of connections in the first embodiment. As a result, the load capacitance of the thin-film transistors for each phase is reduced. Thus, even lower power consumption can be achieved.

<6. Others>

In the above embodiments, the display control circuit 200 desirably controls the frequencies and the amplitudes of the CS clock signal CCK and the gate clock signal GCK, but such control may be performed by each of the CS driver 500 and the gate driver 400.

The present invention is not limited to the configurations of the CS bistable circuit and the gate bistable circuit as exemplified in the embodiments, and various modifications can be made.

The CS clock signal CCK consists of two phases in the first embodiment, and it also consists of three phases in the fifth embodiment, but the present invention is not limited to this. The CS clock signal CCK may consist of four or more phases.

In the above embodiments, the thin-film transistors provided in the bistable circuits have been described as all being of an n-channel type, but the present invention is not limited to this. The present invention can be applied as well even when the thin-film transistors provided in the bistable circuits are of a p-channel type.

Furthermore, various modifications can be made to the embodiments without departing from the sprit and scope of the present invention.

Thus, the present invention renders it possible to provide a liquid crystal display device with reduced power consumption employing a CS drive method, and a method for driving auxiliary capacitance lines in the liquid crystal display device.

INDUSTRIAL APPLICABILITY

The present invention can be applied to liquid crystal display devices with monolithic drivers.

DESCRIPTION OF THE REFERENCE CHARACTERS

40(1) to 40(m) gate bistable circuit (bistable circuit)
40(m+1) gate bistable circuit (dummy stage)
41 to 44 input terminal (input node)
49 output terminal (output node)
50(1) to 50(m) CS bistable circuit (bistable circuit)
50(m+1) CS bistable circuit (dummy stage)
60(1) to 60(m) bias thin-film transistor (first switching element)
61(1) to 61(m) idle-operation thin-film transistor (second switching element)
70(1) to 70(m) output buffer (AND circuit)
80 pixel thin-film transistor (pixel switching element)
300 source driver (video signal line driver circuit)
400 gate driver (scanning signal line driver circuit)
410 gate shift register
420 output buffer group
500 CS driver (auxiliary capacitance line driver circuit)
510 CS shift register
520 CS output portion
600 display portion
800 liquid crystal display panel
900 gate/CS driver
Ep pixel electrode
Ccs auxiliary capacitor
M1 to M4 thin-film transistor (switching element)
C1 capacitor (capacitance element)
N1 first node CSP CS start pulse signal
GSP gate start pulse signal
CCK1 to CCK3 first CS clock signal to third CS clock signal (first shift operation clock signal)
GCK1, GCK2 first gate clock signal, second gate clock signal (second shift operation clock signal)
S set signal
R reset signal
CSS(1) to CSS(m) auxiliary capacitance signal
COUT(1) to COUT(m) control signal
GOUT(1) to GOUT(m) scanning signal
GOUT'(1) to GOUT'(m) control signal
ALL_ON idle-period operation clock signal
T1 scanning period
T2 idle period
tcck1 scanning-period CS cycle
tcck2 idle-period CS cycle
tack2 idle-period ALL_ON cycle
fcck1 scanning-period CS frequency
fcck2 idle-period CS frequency
fack2 idle period ALL_ON frequency
Vcck1 scanning-period CS amplitude
Vcck2 idle-period CS amplitude
Vss low-level direct-current power source potential
Vdd high-level direct-current power source potential

The invention claimed is:

1. A liquid crystal display device comprising:
a display portion including a plurality of video signal lines, a plurality of scanning signal lines crossing the video signal lines, a plurality of pixel forming portions including respective pixel electrodes arranged in a matrix so as to correspond to the video signal lines and the scanning signal lines, a plurality of auxiliary capacitance lines arranged along the scanning signal lines, and auxiliary capacitors formed between the auxiliary capacitance lines and the pixel electrodes corresponding to the scanning signal lines along the auxiliary capacitance lines;
a display control circuit for generating clock signals alternating between on- and off-levels cyclically;
a scanning signal line driver circuit for driving the scanning signal lines such that a scanning period in which the scanning signal lines are selected sequentially and an idle period in which all of the scanning signal lines are in an unselected state alternate with each other in cycles of a frame period consisting of the scanning period and the idle period; and
an auxiliary capacitance line driver circuit formed integrally with the display portion to drive the auxiliary capacitance lines independently of one another in accordance with auxiliary capacitance clock signals included in the clock signals, wherein,
the auxiliary capacitance line driver circuit includes a first shift register with a plurality of first bistable circuits cascaded to one another, the first shift register sequentially setting output signals from the first bistable circuits to an on-level in accordance with first shift operation clock signals included in the auxiliary capacitance clock signals, and
the first shift operation clock signals have a lower frequency during the idle period than during the scanning period.

2. The liquid crystal display device according to claim 1, wherein the first shift operation clock signals have a lower amplitude during the idle period than during the scanning period.

3. The liquid crystal display device according to claim 1, wherein the idle period is longer than the scanning period.

4. The liquid crystal display device according to claim 1, wherein,
  the auxiliary capacitance line driver circuit further includes a plurality of first switching elements with first conduction terminals respectively connected to the auxiliary capacitance lines,
  the display control circuit provides a bias signal to a second conduction terminal of each of the first switching elements, the bias signal switching between two potentials every frame period and being fixed at one of the potentials during each frame period, and
  each of the first switching elements is provided with an output signal at a control terminal, the output signal being derived from the first bistable circuit that corresponds to the auxiliary capacitance line connected to the first conduction terminal of the first switching element.

5. The liquid crystal display device according to claim 4, wherein,
  the display control circuit provides a first bias signal as the bias signal to the second conduction terminal of one of the first switching elements whose first conduction terminals are respectively connected to adjacent auxiliary capacitance lines, and also provides a second bias signal as the bias signal to the second conduction terminal of the other of the first switching elements whose first conduction terminals are respectively connected to the adjacent auxiliary capacitance lines, and
  the first bias signal and the second bias signal differ in potential during each frame period.

6. The liquid crystal display device according to claim 4, wherein,
  the auxiliary capacitance line driver circuit further includes a plurality of second switching elements respectively corresponding to the first switching elements,
  the display control circuit provides an idle-period operation clock signal included in the auxiliary capacitance clock signal to a control terminal of each of the second switching elements, the idle-period operation clock signal having a potential that is at an off-level during the scanning period and that alternates between on-and off-levels cyclically during the idle period, and also having a lower frequency during the idle period than a frequency of the first shift operation clock signals during the scanning period,
  a first conduction terminal of each of the second switching elements is connected to the auxiliary capacitance line that is connected to the first conduction terminal of the first switching element that corresponds to the second switching element, and
  the bias signal provided to the second conduction terminal of the first switching element that corresponds to the second switching element is provided to a second conduction terminal of each of the second switching elements.

7. The liquid crystal display device according to claim 1, wherein the first shift operation clock signals are of three or more phases different from one another.

8. The liquid crystal display device according to claim 1, wherein the scanning signal line driver circuit is formed integrally with the display portion.

9. The liquid crystal display device according to claim 8, wherein the scanning signal line driver circuit includes a second shift register for sequentially setting output signals from a plurality of second bistable circuits cascaded to one another, to an on-level in accordance with a plurality of second shift operation clock signals included in the clock signals, the scanning signal line driver circuit providing the output signals from the second bistable circuits to the scanning signal lines, respectively.

10. The liquid crystal display device according to claim 8, wherein,
  the scanning signal line driver circuit and the auxiliary capacitance line driver circuit share the first shift register,
  the scanning signal line driver circuit further includes a plurality of output buffers provided corresponding to the first bistable circuits respectively,
  the display control circuit provides the output buffers with buffer input signals being set at an on-level during the scanning period and also at an off-level during the idle period, and
  the output buffers provide the scanning signal lines with logical ANDs of the buffer input signals and output signals from the first bistable circuits corresponding thereto.

11. The liquid crystal display device according to claim 8, wherein the scanning signal line driver circuit and the auxiliary capacitance line driver circuit are realized using thin-film transistors whose semiconductor layers are made of an oxide semiconductor.

12. The liquid crystal display device according to claim 8, wherein the scanning signal line driver circuit and the auxiliary capacitance line driver circuit are realized using thin-film transistors whose semiconductor layers are made of amorphous silicon.

13. The liquid crystal display device according to claim 1, wherein the auxiliary capacitance line driver circuit is realized using thin-film transistors whose semiconductor layers are made of an oxide semiconductor.

14. The liquid crystal display device according to claims 1, wherein the auxiliary capacitance line driver circuit is realized using thin-film transistors whose semiconductor layers are made of amorphous silicon.

15. A drive method for auxiliary capacitance lines in a liquid crystal display device provided with a display portion including a plurality of video signal lines, a plurality of scanning signal lines crossing the video signal lines, a plurality of pixel forming portions including respective pixel electrodes arranged in a matrix so as to correspond to the video signal lines and the scanning signal lines, a plurality of auxiliary capacitance lines arranged along the scanning signal lines, and auxiliary capacitors formed between the auxiliary capacitance lines and the pixel electrodes corresponding to the scanning signal lines along the auxiliary capacitance lines, a display control circuit for generating clock signals alternating between on- and off-levels cyclically, a scanning signal line driver circuit for driving the scanning signal lines, and an auxiliary capacitance line driver circuit formed integrally with the display portion to drive the auxiliary capacitance lines, the method comprising the steps of:
  driving the scanning signal lines such that a scanning period in which the scanning signal lines are selected sequentially and an idle period in which all of the scanning signal lines are in an unselected state alternate with each other in cycles of a frame period consisting of the scanning period and the idle period;
  driving the auxiliary capacitance lines independently of one another in accordance with auxiliary capacitance clock signals included in the clock signals; and
  setting first shift operation clock signals included in the auxiliary capacitance clock signals at a lower frequency during the idle period than during the scanning period, wherein, the auxiliary capacitance line driver circuit includes a first shift register with a plurality of first bistable circuits cascaded to one another, the first shift register sequentially setting output signals from the first bistable circuits to an on-level in accordance with the first shift operation clock signals.

16. The drive method according to claim 15, wherein the first shift operation clock signals have a lower amplitude during the idle period than during the scanning period.

17. The drive method according to claim 15, wherein the idle period is longer than the scanning period.

18. The drive method according to claim 15, wherein the first shift operation clock signals are of three or more phases different from one another.

* * * * *